(12) United States Patent
Mizuno

(10) Patent No.: US 6,967,517 B2
(45) Date of Patent: Nov. 22, 2005

(54) SWITCHING DEVICE

(75) Inventor: Koichi Mizuno, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/752,664

(22) Filed: Jan. 8, 2004

(65) Prior Publication Data

US 2004/0183583 A1 Sep. 23, 2004

Related U.S. Application Data

(63) Continuation of application No. PCT/JP03/07896, filed on Jun. 20, 2003.

(30) Foreign Application Priority Data

| Jun. 2, 2002 | (JP) | ........................................ 2002-180124 |
| Jul. 17, 2002 | (JP) | ........................................ 2002-208598 |

(51) Int. Cl.[7] .............................................. H01P 1/22
(52) U.S. Cl. ..................................... 327/308; 333/81 R
(58) Field of Search ................................ 327/308, 427, 327/431, 434, 435, 436, 407, 408; 333/101, 103, 81 R

(56) References Cited

U.S. PATENT DOCUMENTS

| 4,890,077 | A | * | 12/1989 | Sun ........................... 333/81 A |
| 5,345,123 | A | * | 9/1994 | Staudinger et al. .......... 327/308 |
| 5,519,634 | A | | 5/1996 | Kato et al. .................... 323/371 |
| 5,767,721 | A | * | 6/1998 | Crampton ..................... 327/308 |
| 5,903,178 | A | | 5/1999 | Miyatsujl et al. ............. 327/308 |
| 5,917,632 | A | | 6/1999 | Lesesky ........................ 327/408 |
| 6,229,370 | B1 | * | 5/2001 | Inamori et al. .............. 327/308 |

FOREIGN PATENT DOCUMENTS

| JP | 02-090723 | 3/1990 |
| JP | 03-145801 | 6/1991 |

(Continued)

Primary Examiner—Tuan T. Lam
(74) Attorney, Agent, or Firm—McDermott Will & Emery LLP

(57) ABSTRACT

The present invention provides a switching device comprising first to third connection terminals, a first FET provided with a pair of terminals one of which is connected, via a first direct-current blocking capacitive element, to the first connection terminal and the other of which is connected, via another first direct-current blocking capacitive element, to the second connection terminal, and a second FET provided with a pair of terminals one of which is connected, via a second direct-current blocking capacitive element, to the first connection terminal and the other of which is connected, via another second direct-current blocking capacitive element, to the third connection terminal. The channel type of the first FET is the same as the channel type of the second FET. A first bias voltage is applied to a gate of the first FET, and a second bias voltage is applied to both the main terminals of the second FET. In addition, either a voltage having a first given value or a voltage having a second given value is applied, as a first control value, to both the main terminals of the first FET and to a gate of the second FET, thereby establishing switching between a first connection state of electrically connecting the first connection terminal and the second connection terminal with each other and a second connection state of electrically connecting the first connection terminal and the third connection terminal with each other.

9 Claims, 19 Drawing Sheets

FOREIGN PATENT DOCUMENTS

| | | |
|---|---|---|
| JP | 04-033501 | 2/1992 |
| JP | 04-346513 | 12/1992 |
| JP | 5-43622 | 6/1993 |
| JP | 05-299995 | 11/1993 |
| JP | 06-085641 | 3/1994 |
| JP | 06-132701 | 5/1994 |
| JP | 07-235802 | 9/1995 |
| JP | 08-18302 | 1/1996 |
| JP | 08-213891 | 8/1996 |
| JP | 08-228138 | 9/1996 |
| JP | 08-288400 | 11/1996 |
| JP | 09-027736 | 1/1997 |
| JP | 09-107203 | 4/1997 |
| JP | 10-215162 | 8/1998 |
| JP | 10-313266 | 11/1998 |
| JP | 10-335901 | 12/1998 |
| JP | 2000-099559 | 4/2000 |
| JP | 2000-349502 | 12/2000 |
| JP | 2002-141794 | 5/2002 |
| WO | WO 2004/019493 | 4/2004 |

* cited by examiner

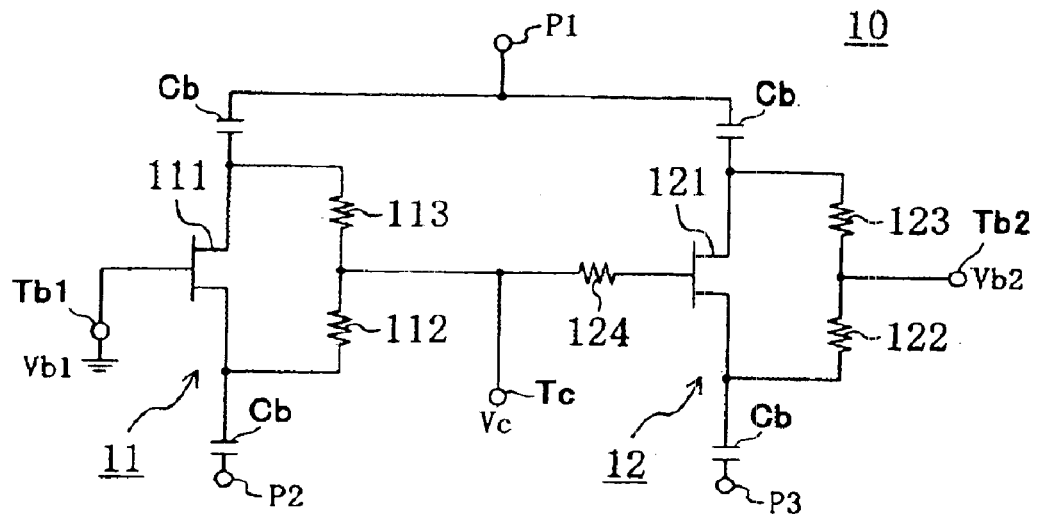
Fig. 1
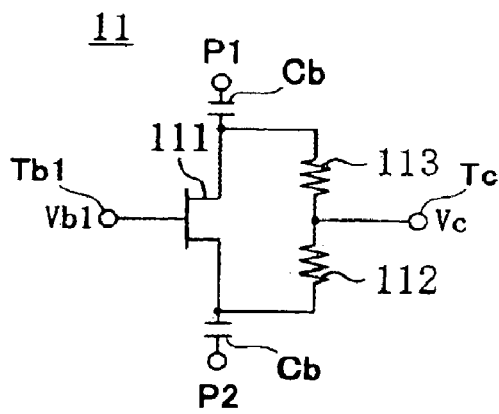 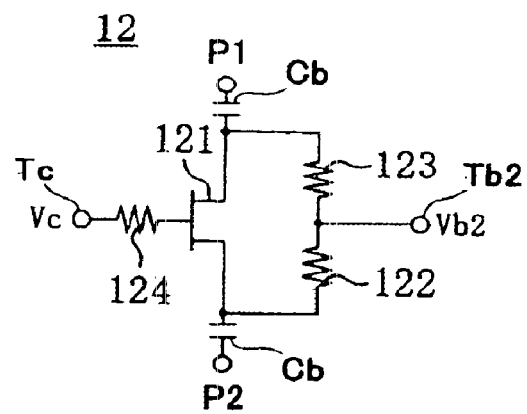
Fig. 2A          Fig. 2B

SWITCHING DEVICE

This is a continuation application under 35 U.S.C 111(a) of pending prior International Application No. PCT/JP03/07896, filed on Jun. 20, 2003.

BACKGROUND OF THE INVENTION

1. Field of the Invention

This invention relates to switching devices and, more particularly, to a switching device suitable for switching of transmission path.

2. Description of the Related Art

With the recent significant advancement in the field of information and communications technology, the frequency bands of signals that communication equipment is required to deal with has been developed to higher frequency band levels ranging from microwave band to millimeter wave band. Communication circuits dealing with high frequency bands ranging from microwave band to millimeter wave band usually employ a switch of the path switching type for transmission line control.

Generally, a typical switch of the path switching type comprises a combination of PIN diode switches making use of a semiconductor P/I/N junction or a combination of FET (field-effect transistor) switches making use of a FET switching function. For example, in a switching device of the path switching type composed of two FET switches connected to respective transmission paths as switching targets, one of the two FET switches is turned on (off) while the other FET switch is turned off (on). More specifically, the FET switches operate in a complementary manner, such that the one FET switch is turned on when the other switch is turned off, and the other FET is turned on when the one FET switch is turned off for switching of transmission path.

On the other hand, the demand for the miniaturization of high frequency circuits becomes increasingly stronger in comparison with other electronic circuits. Generally, the high frequency circuit is formed as an MMIC (Monolithic Microwave IC) in which a semiconductor device (e.g., a high frequency transistor), a matching circuit, a bias circuit et cetera are integrated with each other on a single semiconductor substrate. For the case of the MMIC, preferably the switch itself is composed of a semiconductor device. Consequently, commonly-used MMICs employ for example PIN diodes or FET switches. However, the process of fabricating a PIN junction is complicated in comparison with the process of fabricating a FET. Therefore, it is preferable to form a switching device only with FETs.

In the FET switch, the control voltage is applied to a gate electrode of a FET so that the channel conductivity changes to vary the source-drain conductivity. Thereby, according to the source-drain conductivity variation, the amount of transmission of the transmission signal between the source and the drain is varied. In other words, the FET switch is turned on when the channel layer of the FET is placed in the electrically conductive state, and the transmission signal is input to one of the drain and source terminals, passes through the channel, and is output from the other of the drain and source terminals. On the other hand, the FET switch is turned off when the channel layer is placed in the pinch-off state, and the source and the drain are electrically disconnected from each other. For the case of high frequency signals, generally HEMTs (High Electron Mobility Transistors) in which n-type channel layers are formed are employed.

In order that a plurality of FET switches composed of FETs of the same channel type can operate in a complementary manner (in other words, certain of the plural FET switches are turned on (off) while the remaining FET switches are turned off (on)), it is required that FETs of the certain FET switches and FETs of the remaining FET switches be given different control voltages so that each FET switch performs a switching operation. However, in the light of ease of control and circuitry simplification, it is desirable that a plurality of FETs operate in a complementary switching manner with a single control voltage.

Furthermore, for the case of frequently-used n-channel FETs of the depletion type, it is necessary to apply a negative potential (hereinafter referred to as "the negative voltage") with respect to the source potential to the gate electrode so that the channel is placed in the pinch-off state. However, generally the source electrode is grounded, so that, when employing such a depletion type n-channel FET as a switching device, there must be provided a negative power supply for gate electrode control in addition to the provision of a positive power supply for drain biasing.

Additionally, for the case of high frequency signals, when a transmission path is switched, if a transmission line of the disconnected side remains in the open state, an impedance of the transmission line becomes discontinuous at the open point and, as a result, signal reflection occurs at the open point. This high frequency signal reflection makes the circuit characteristics worse, resulting in unstable circuit operations.

Furthermore, the FET has a channel resistance. Because of this, insertion of a switch composed of FETs results in transmission loss due to the FET channel resistance.

In addition to the above-mentioned technologies, there are other technologies about switching devices for use in transmission path switching (see Japanese Pat. No. 2848502, Japanese Pat. No. 3068065, Japanese Pat. Kokai Pub. No. (1992)33501, Japanese Pat. Kokai Pub. No. (2000)349502, Japanese Pat. Kokai Pub. No. (1990)90723, Japanese Pat. Kokai Pub. No. (1996)213891, Japanese Pat. Kokai Pub. No. (1991)145801, Japanese Pat. Kokai Pub. No. (1992) 346513, Japanese Pat. Kokai Pub. No. (1994)85641, Japanese Pat. Kokai Pub. No. (1998)313266, Japanese Pat. Kokai Pub. No. (1998)335901, Japanese Pat. Kokai Pub. No. (1995)235802, Japanese Pat. Kokai Pub. No. (1994) 132701, Japanese Pat. Kokai Pub. No. (2002)141794, Japanese Pat. Kokai Pub. No. (1996)288400, Japanese Pat. Kokai Pub. No. (1997)27736, and Japanese Pat. Kokai Pub. No. (1997)107203).

SUMMARY OF THE INVENTION

Accordingly, a first object of the present invention is to provide a switching device with a plurality of FET switches of the same channel type which is capable of switching transmission path in a complementary manner with a single control voltage.

A second object of the present invention is to provide a switching device with a plurality of FET switches of the same channel type which is capable of switching transmission path in a complementary manner only with a positive power supply.

A third object of the present invention is to provide a switching device with a plurality of FET switches of the same channel type which is capable of suppressing transmission signal reflections in a transmission path disconnected by switching.

A fourth object of the present invention is to provide a switching device with a plurality of FET switches of the same channel type which is capable of reducing transmission loss due to the FET channel resistance.

In order to achieve these objects, the present invention provides a switching device comprising:

a first connection terminal, a second connection terminal, a third connection terminal, a pair of first direct-current blocking capacitive elements, a first FET provided with a pair of main terminals, one of which is connected, via one of the first direct-current blocking capacitive elements, to the first connection terminal and the other of which is connected, via the other of the first direct-current blocking capacitive elements, to the second connection terminal, and a pair of second direct-current blocking capacitive elements, a second FET provided with a pair of main terminals, one of which is connected, via one of the second direct-current blocking capacitive elements, to the first connection terminal and the other of which is connected, via the other of the second direct-current blocking capacitive elements, to the third connection terminal, wherein:

a channel type of the first FET is the same as a channel type of the second FET, a first bias voltage is applied to a gate of the first FET, a second bias voltage is applied to the pair of main terminals of the second FET, and either one of voltages, which are respectively lower and higher than both a voltage derived from subtracting a gate threshold voltage of the first FET with a sign from the first bias voltage and a voltage derived from adding a gate threshold voltage of the second FET with a sign to the second bias voltage, is applied to the pair of main terminals of the first FET and to a gate of the second FET as a first control voltage, whereby the first FET and the second FET enter a conductive state and a cut off state in a complementary manner to allow switching between a first connection state and a second connection state, wherein, in the first connection state, the first connection terminal and the second connection terminal are electrically connected to each other and the first connection terminal and the third connection terminal are electrically disconnected from each other and, in the second connection state, the first connection terminal and the third connection terminal are electrically connected to each other and the first connection terminal and the second connection terminal are electrically disconnected from each other.

As a result of such arrangement, it becomes possible to switch signal transmission path in a complementary manner with a single control voltage.

It may be arranged such that the first bias voltage, the second bias voltage, and the first control voltage have voltage values not less than a ground potential. As a result of such arrangement, it becomes possible to switching signal transmission path in a complementary manner only with a positive power supply.

Preferably, a frequency of signal input to and output from the first, second, and third connection terminals is not less than 100 MHz and not more than 75 GHz.

More preferably, the frequency of signal input to and output from the first, second, and third connection terminals is not less than 100 MHz and not more than 10 GHz.

It may be arranged such that the switching device further comprises a control voltage terminal for application of the first control voltage, wherein the pair of main terminals of the first FET and the gate of the second FET are connected to the control voltage terminal.

It may be arranged such that the pair of main terminals of the first FET are connected to the control voltage terminal via first bias resistor elements, respectively.

Preferably, the sum of the resistance values of the two first bias resistor elements is not less than 100 times and not more than 100,000 times the ON resistance of the first FET. As a result of such arrangement, it becomes possible to prevent the occurrence of a signal leak when the first FET is placed in cut off state.

More preferably, the sum of the resistance values of the two first bias resistor elements is not less than 1,000 times and not more than 100,000 times the ON resistance of the first FET. As a result of such arrangement, it becomes possible to prevent, in a more preferred manner, the occurrence of a signal leak when the first FET is placed in cut off state.

It may be arranged such that the switching device further comprises a bias voltage terminal, wherein the pair of main terminals of the second FET are connected to the bias voltage terminal via second bias resistor elements, respectively.

Preferably, the sum of the resistance values of the two second bias resistor elements is not less than 100 times and not more than 100,000 times the ON resistance of the second FET. As a result of such arrangement, it becomes possible to prevent the occurrence of a signal leak when the second FET is placed in cut off state.

More preferably, the sum of the resistance values of the two second bias resistor elements is not less than 1,000 times and not more than 100,000 times the ON resistance of the second FET. As a result of such arrangement, it becomes possible to prevent, in a more preferred manner, the occurrence of a signal leak when the second FET is placed in cut off state.

It may be arranged such that the first and second FETs are n-channel type FETs. As a result of such arrangement, it becomes possible to speed up the operation of the switching device by the use of HEMTs and HFETs.

It may be arranged such that the first control voltage takes two values, one of which is a voltage equal to the first bias voltage and the other of which is a voltage equal to the second bias voltage. As a result of such arrangement, it becomes possible to achieve both ease of control and circuitry simplification.

It may be arranged such that the first and second FETs are depletion type FETs. As a result of such arrangement, even when using depletion type FETs which generally require the provision of a negative power supply, it becomes possible to perform operations only with a positive power supply by appropriate selection of the bias voltages and the first control voltage. This makes the present invention particularly effective.

It may be arranged such that both the first FET and the second FET are formed by a compound semiconductor composed of a compound made up of at least one element selected from among Ga, In, and Al and at least one element selected from among As, P, and N.

It may be arranged such that the switching device further comprises a third FET and a fourth FET, wherein:

one of a pair of main terminals of the third FET is connected, via a third direct-current blocking capacitive element, to the second connection terminal while the other of the main terminals of the third FET is connected, via a fourth direct-current blocking capacitive element or via the fourth direct-current blocking capacitive element and a first termination resistor element, to ground, one of a pair of main terminals of the fourth FET is connected, via a fifth direct-current blocking capacitive element, to the third connection terminal while the other of the main terminals of the fourth FET is connected, via a sixth direct-current blocking capacitive element or via the sixth direct-current blocking capacitive element and a second termination resistor element, to ground, a channel type of the third FET is the same as a channel type of the fourth FET, a third bias voltage is applied to a gate of the fourth FET, a fourth bias voltage is applied to the pair of main terminals of the third FET, and either one of voltages, which are respectively lower and higher than both a voltage derived from subtracting a gate threshold voltage of the fourth FET with a sign from the third bias voltage and a voltage derived from adding a gate threshold voltage of the third FET with a sign to the fourth bias voltage, is applied, as a second control voltage, to the pair of main terminals of the fourth FET and to a gate of the third FET in synchronization with the first control voltage, whereby a group of the first and fourth FETs and a group of the second and third FETs enter the conductive state and the cut off state in a complementary manner, thereby the third connection terminal is terminated in the first connection state and the second connection terminal is terminated in the second connection state.

As a result of such arrangement, it becomes possible to suppress transmission signal reflection in a transmission path disconnected by switching.

It may be arranged such that the switching device further comprising a transmission line, having a second transmission signal terminal at one end thereof and a third transmission signal terminal at the other end thereof, for transmitting transmission signal, wherein:

the first and second FETs are connected, via the transmission line, to the first connection terminal and the second and third connection terminals are connected to ground, the first connection terminal is connected to a connection point on the transmission line, and the first FET is connected, via the first direct-current blocking capacitive element, to a first point on the transmission line which is located a distance corresponding to odd-numbered times the quarter-wavelength of the transmission signal apart from the connection point of the first connection terminal toward the second transmission signal terminal while the second FET is connected, via the second direct-current blocking capacitive element, to a second point on the transmission line which is located a distance corresponding to odd-numbered times the quarter-wavelength of the transmission signal apart from the connection point of the first connection terminal toward the third transmission signal terminal, the first connection terminal constitutes a first transmission signal terminal, and in response to switching between the first connection state and the second connection state, switching between a first transmission signal connection state and a second transmission signal connection state is established, wherein, in the first transmission signal connection state, the first transmission signal terminal and the second transmission signal terminal are connected to each other to allow the transmission signal be transmitted and the first transmission signal terminal and the third transmission signal terminal are disconnected from each other not to allow the transmission signal be transmitted and, in the second transmission signal connection state, the first transmission signal terminal and the third transmission signal terminal are connected to each other to allow the transmission signal be transmitted and the first transmission signal terminal and the second transmission signal terminal are disconnected from each other not to allow the transmission signal be transmitted.

As a result of such arrangement, no FET is disposed in the transmission path along which transmission signals are transmitted, thereby making it possible to reduce transmission loss due to the FET channel resistance.

Preferably, a frequency of signal input to and output from the first, second, third transmission signal terminals is not less than 100 MHz and not more than 75 GHz.

More preferably, the frequency of signal input to and output from the first to third transmission signal terminals is not less than 100 MHz and not more than 10 GHz.

It may be arranged such that the switching device further comprising a third FET and a fourth FET, wherein:

one of a pair of main terminals of the third FET is connected, via a third direct-current blocking capacitive element, to a third point which is located a distance corresponding to odd-numbered times the quarter-wavelength of the transmission signal apart from the first point toward the second transmission signal terminal on the transmission line, while the other of the main terminals of the third FET is connected, via a fourth direct-current blocking capacitive element or via the fourth direct-current blocking capacitive element and a first termination resistor element, to ground, and the ON resistance of the third FET or the sum of the ON resistance of the third FET and the resistance of the first termination resistor element is substantially the same as a characteristic impedance of the transmission line, one of a pair of main terminals of the fourth FET is connected, via a fifth direct-current blocking capacitive element, to a fourth point which is located a distance corresponding to odd-numbered times the quarter-wavelength of the transmission signal apart from the second point toward the third transmission signal terminal on the transmission line, while the other of the main terminals of the fourth FET is connected, via a sixth direct-current blocking capacitive element or via the sixth direct-current blocking capacitive element and a second termination resistor element, to ground, and the ON resistance of the fourth FET or the sum of the ON resistance of the fourth FET and the resistance of the second termination resistor element is substantially the same as the characteristic impedance of the transmission line, a channel type of the third FET is the same as a channel type of the fourth FET, a third bias voltage is applied to a gate of the third FET, a fourth bias voltage is applied to the pair of main terminals of the fourth FET, and either one of voltages, which are respectively lower and higher than both a voltage derived from subtracting a gate threshold voltage of the third FET with a sign from the third bias voltage and a voltage derived from adding a gate threshold voltage of the fourth FET with a sign to the fourth bias voltage, is applied, as a second control voltage, to the pair of main terminals of the third FET and to a gate of the fourth FET in synchronization with the first control voltage, whereby a group of the first and third FETs and a group of the second and fourth FETs enter the conductive state and the cut off state in a complementary manner, thereby, in the first transmission signal connection state, the second point is grounded and the fourth point is terminated and, in the second transmission signal connection state, the first point is grounded and the third point is terminated.

As a result of such arrangement, it becomes possible to suppress reflection in the disconnected transmission line.

It may be arranged such that the first control voltage is applied as the second control voltage. As a result of such arrangement, it becomes possible to facilitate control of the switching device.

It may be arranged such that the first bias voltage is applied as the third bias voltage, and the second bias voltage is applied as the fourth bias voltage. As a result of such arrangement, it becomes possible to provide a simplified circuit structure of the switching device.

These objects as well as other objects, features and advantages of the present invention will become apparent to those skilled in the art from the following description with reference to the accompanying drawings.

BRIEF DESCRIPTION OF THE DRAWINGS

FIG. 1 is a circuit diagram of a switching device according to a first embodiment of the present invention;

FIGS. 2A and 2B are circuit diagrams of FET switches of FIG. 1;

FIGS. 8A–C are graphs showing the Id-Vgs characteristics of different FETs other than the n-channel depletion type, wherein FIG. 8A is a graph showing the Id-Vgs characteristics of an n-channel enhancement type FET, FIG. 8B is a graph showing the Id-Vgs characteristics of a p-channel depletion type FET, and FIG. 8C is a graph showing the Id-Vgs characteristics of a p-channel enhancement type FET;

FIGS. 9A–C are diagrams showing methods of setting a control voltage for the n-channel depletion type FET, wherein FIG. 9A is a graph showing a control voltage setting method in the case where the ON-OFF switching voltage of the first FET is lower than the ON-OFF switching voltage of the second FET, FIG. 9B is a graph showing another control voltage setting method in the case where the ON-OFF switching voltage of the first FET is higher than the ON-OFF switching voltage of the second FET, and FIG. 9C is a graph showing still another control voltage setting method in the case where the ON-OFF switching voltage of the first FET agrees with the ON-OFF switching voltage of the second FET;

FIGS. 10A–C are diagrams showing methods of setting a control voltage for the p-channel depletion type FET, wherein FIG. 10A is a diagram showing a control voltage setting method in the case where the ON-OFF switching voltage of the first FET is lower than the ON-OFF switching voltage of the second FET, FIG. 10B is a diagram showing another control voltage setting method in the case where the ON-OFF switching voltage of the first FET is higher than the ON-OFF switching voltage of the second FET, and FIG. 10C is a diagram showing still another control voltage setting method in the case where the ON-OFF switching voltage of the first FET agrees with the ON-OFF switching voltage of the second FET;

FIGS. 11A–C are diagrams showing methods of setting a control voltage for the n-channel enhancement type FET, wherein FIG. 11A is a diagram showing a control voltage setting method in the case where the ON-OFF switching voltage of the first FET is lower than the ON-OFF switching voltage of the second FET, FIG. 11B is a diagram showing another control voltage setting method in the case where the ON-OFF switching voltage of the first FET is higher than the ON-OFF switching voltage of the second FET, and FIG. 11C is a diagram showing still another control voltage setting method in the case where the ON-OFF switching voltage of the first FET agrees with the ON-OFF switching voltage of the second FET;

FIGS. 12A–C are diagrams showing methods of setting a control voltage for the p-channel enhancement type FET, wherein FIG. 12A is a diagram showing a control voltage setting method in the case where the ON-OFF switching voltage of the first FET is lower than the ON-OFF switching voltage of the second FET, FIG. 12B is a diagram showing another control voltage setting method in the case where the ON-OFF switching voltage of the first FET is higher than the ON-OFF switching voltage of the second FET, and FIG. 12C is a diagram showing still another control voltage setting method in the case where the ON-OFF switching voltage of the first FET agrees with the ON-OFF switching voltage of the second FET;

DETAILED DESCRIPTION OF THE PREFERRED EMBODIMENTS

Figure 3:
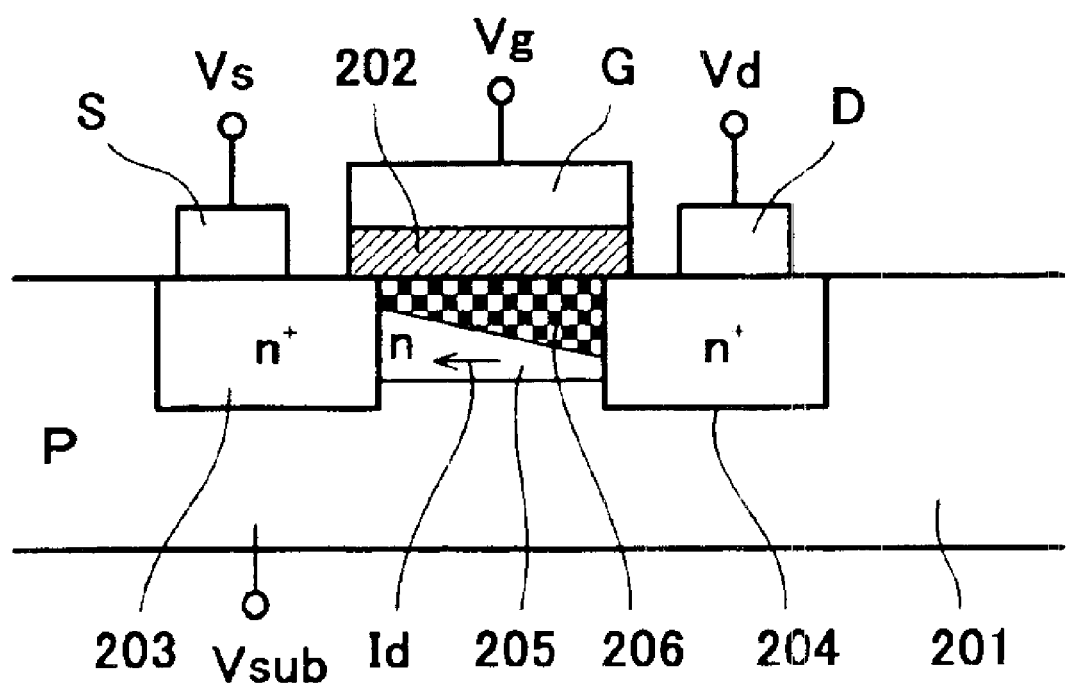
FIG. 3 is a sectional view diagrammatically showing a structure of the FET of FIG. 1.

Hereinafter, embodiments of the present invention will be described with reference to the accompanying drawings.

Embodiment 1

FIG. 1 is a circuit diagram of a switching device 10 according to a first embodiment of the present invention.

FIG. 2A is a circuit diagram of a FET switch 11 of FIG. 1. FIG. (2b) is a circuit diagram of a FET switch 12 of FIG. 1.

Referring to FIGS. 1 and 2, the switching device 10 of the present embodiment comprises a first connection terminal P1 (hereinafter referred to as the "terminal P1"), a second connection terminal P2 (hereinafter referred to as the "terminal P2"), and a third connection terminal P3 (hereinafter referred to as the "terminal P3"). A first FET switch 11 (hereinafter referred to as the "FET switch 11") is provided between the terminals P1 and P2, and a second FET switch 12 (hereinafter referred to as the "FET switch 12") is provided between the terminals P1 and P3. The FET switches 11 and 12 are placed complimentarily in conduction state (ON state) and in cut-off state (OFF state) to thereby switch a connection state of the switching device 10 between a first connection state in which the terminals P1 and P2 are electrically connected to each other while the terminals P1 and P3 are electrically disconnected from each other and a second connection state in which the terminals P1 and P3 are electrically connected to each other while the terminals P1 and P2 are electrically disconnected from each other.

More specifically, the FET switch 11 has a first FET 111 (hereinafter referred to as the "FET 111"). In the FET 111, the drain is connected to the terminal P1 via a direct-current blocking capacitive element (capacitor) Cb while the source is connected to the terminal P2 via another direct-current blocking capacitive element Cb. The drain and the source of the FET 111 are connected to a control voltage terminal Tc via a drain bias resistor element 113 (which is a first bias resistor element) and via a source bias resistor element 112 (which is a first bias resistor element), respectively. A direct-current control voltage is fed to the control voltage terminal Tc. As a result of such arrangement, when the control voltage Vc is fed to the control voltage terminal Tc, the direct-current blocking capacitive elements Cb are charged so that both the source and the drain are held at the level of the control voltage Vc, and the control voltage Vc, which is of direct-current, is prevented from being applied to the terminals P1 and P2 and, further to electric circuits connected thereto. A gate of the FET 111 is connected to a first bias terminal Tb1. First bias voltage Vb1 which is of direct-current is fed to the first bias terminal Tb1.

On the other hand, the FET switch 12 has a second FET 121 (hereinafter referred to as the "FET 121"). In the FET 121, the drain is connected to the terminal P1 via a direct-current blocking capacitive element Cb while the source is connected to the terminal P3 via another direct-current blocking capacitive element Cb. The drain and the source of the FET 121 are connected to a second bias terminal Tb2 via a drain bias resistor element 123 (which is a second bias resistor element) and via a source bias resistor element 122 (which is another second bias resistor element), respectively. Second bias voltage Vb2 which is of direct-current is fed to the second bias terminal Tb2. As a result of such arrangement, when the second bias voltage Vb2 is applied to the second bias terminal Tb2, the direct-current blocking capacitive elements Cb are charged so that both the source and the drain are held at the level of the second bias voltage Vb2, and the second bias voltage Vb2, which is of direct-current, is prevented from being applied to the terminals P1 and P3 and, further to electric circuits connected thereto. A gate of the FET 121 is connected to the control voltage terminal Tc.

In the present embodiment, as described above, of the source and the drain of each of the FETs 111 and 121, the one connected to the terminal P1 is called the "drain", and the other is called the "source". However, since the source and the drain are biased to substantially the same potential in the present embodiment, making a distinction between the source and the drain is meaningless. Therefore, the one connected to the terminal P1 may be called the "source", and the other may be called the "drain". Since it is meaningless to make a distinction between the source and the drain for the reason described above, and since a transmission signal is input to and output from both the source and the drain, they are defined as and may be called the "main terminals" in the specification as well as in the attached claims.

In the present embodiment, the source and the drain of the FET 111, and the gate of the FET 121 are connected to the common control voltage terminal Tc; however, they may be connected to respective control voltage terminals Tc.

The terminals P1, P2, and P3 are connected to other electric circuits, and high-frequency alternating-current signal are input to and output from the terminals P1, P2, and P3. Such alternating-current signals pass through the direct-current blocking capacitive elements Cb provided in a signal transmission path extending from the terminal P1 to the terminal P2, and through the direct-current blocking capacitive elements Cb provided in a signal transmission path extending from the terminal P1 to the terminal P3. The lower limit of the frequency of these signals is restricted mainly by the frequency characteristics of the direct-current blocking capacitive elements Cb, and the upper limit of the frequency of these signals is restricted mainly by the frequency characteristics of the FETs 111 and 121. Therefore, the frequency of the signals input to and output from the terminals P1, P2, and P3 is preferably not less than 100 MHz and not more than 75 GHz, more preferably not less than 100 MHz and not more than 10 GHz.

The FET 111 and the FET 121 are of the same channel type. More specifically, the FETs 111 and 121 are n-channel type HEMTs (or HFETs), the reason for which is that the mobility of carriers (electrons) in the n-channel type HEMT (or HFET) is higher than the mobility of carriers (electron holes) in the p-channel type HEMT (or HFET). Therefore, it becomes possible to operate the switching device 10 at high speeds by forming the FETs 111 and 121 by n-channel type HEMTs (or HFETs). As a result, the switching device 10 becomes suitable for high-frequency applications.

Preferably, the HEMT is constituted by a compound semiconductor made of a compound composed of at least one element selected from among a group of Ga, In, and Al and at least one element selected from among a group of As, P, and N. It is needless to say that the HEMT can be constituted by a compound semiconductor containing other than these elements.

In the present embodiment, the FETs 111 and 121 are implemented by depletion type FETs. With this arrangement, the gate voltage, which is the bias voltage Vb1 for the FET 111 and the control voltage Vc for the FET 121, can be set low because the depletion type FET has a negative gate threshold voltage.

The source bias resistor element 112 and the drain bias resistor element 113 are connected in series between the drain and the source of the FET 111 and, on the other hand, the source bias resistor element 122 and the drain bias resistor element 123 are connected in series between the drain and the source of the FET 121. Therefore, the resistance value of each of the resistor elements 112, 113, 122, and 123 should be great enough to substantially prevent the leak of transmission signals from the terminal P1 to the terminal P2 and the leak of transmission signals from the terminal P1 to the terminal P3. To this end, both the sum of the resistance value of the source bias resistor element 112 and the resistance value of the drain bias resistor element 113, and the sum of the resistance value of the source bias resistor element 122 and the resistance value of the drain bias resistor element 123 are preferably not less than 100 times and not more than 100,000 times the ON resistance of the FETs 111 and 121 (i.e., the drain-source resistance when in the conductive state), more preferably not less than 1,000 times and not more than 100,000 times the ON resistance. In the present embodiment, the resistance value of each of the source bias resistor element 112, the drain bias resistor element 113, the source bias resistor element 122, and the drain bias resistor element 123 is set at 5 kΩ. In other words, since the ON resistance of each of the FETs 111 and 121 is several ohms, both the sum of the resistance value of the source bias resistor element 112 and the resistance value of the drain bias resistor element 113 and the sum of the resistance value of the source bias resistor element 122 and the resistance value of the drain bias resistor element 123 are so set as to be about 2,000 times the ON resistance of each of the FETs 111 and 121. The impedance between gate and source and the impedance between gate and drain are sufficiently great, so that the provision of the resistor element 124 can be omitted.

The control voltage Vc and the bias voltage Vb2 are set to above the ground potential. Furthermore, the bias voltage Vb1 is set to a value not less than the gate threshold voltage of the FET 111. On the other hand, the bias voltage Vb2 is set to a value not less than the gate threshold voltage of the FET 121. Setting examples and setting methods of these voltages will be described later in detail. Hereby, it becomes possible for the switching device 10 to operate only by a positive power supply. In the present embodiment, the control voltage Vc is settable in a range from about 0 V to about 5 V, and the bias voltages Vb1 and Vb2 are settable in a range from about 0 V to about 3 V. Furthermore, if the FET 121 is implemented by a FET that has high resistance to voltage, this makes it possible to increase the value of the bias voltage Vb2 up to about 3.5 V.

Hereinafter, the operation of the switching device 10 as constructed above will be described.

First, the structure and the operation of n-channel depletion type FETs which constitute the FETs 111 and 121 will be described briefly.

Figure 4:
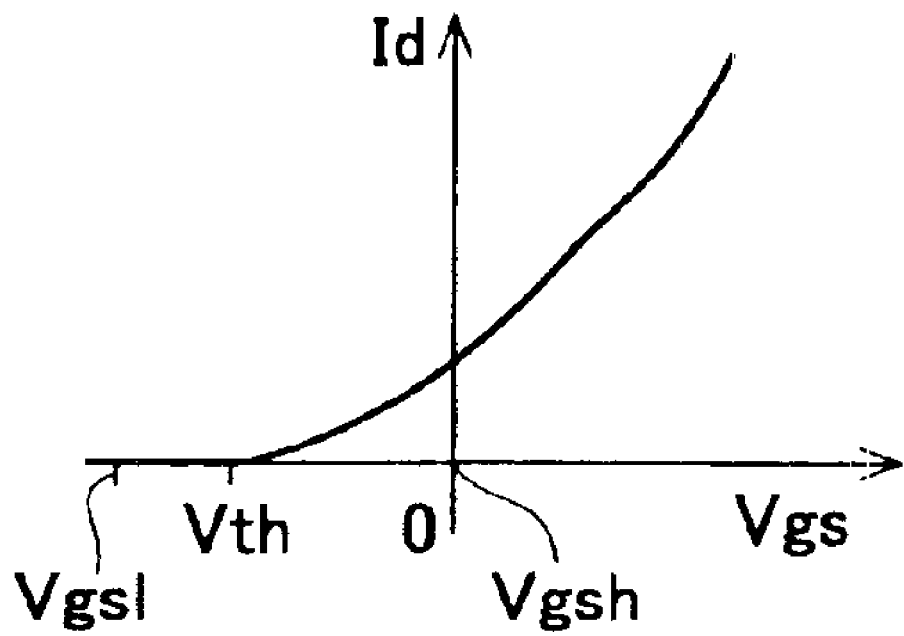
FIG. 4 is a graph showing the Id-Vgs characteristics of the FET of FIG. 1.

FIG. 3 is a cross sectional view diagrammatically depicting the structure of a FET of FIG. 1. FIG. 4 is a graph representing the Id-Vgs characteristics of the FET of FIG. 1.

For the sake of convenience, in the specification of the present invention, the bias voltage and the control voltage are represented by the potential difference with respect to the ground potential. Likewise, the potential of each of the substrate, source, drain, and gate of a FET is represented by the potential difference with respect to the ground potential, and they are referred to as the "substrate voltage", the "source voltage", the "drain voltage", and the "gate voltage", respectively. The voltage difference between the gate voltage and the source voltage when the source voltage is a reference voltage (i.e., [the gate voltage]–[the source voltage]), is referred to as the "gate-source voltage" and is represented by Vgs.

In a depletion type FET as shown in FIG. 3, a gate electrode (gate) G, a source electrode (source) S, and a drain electrode (drain) D are formed on a semiconductor substrate 201 such that the gate electrode G lies between the source electrode S and the drain electrode D. Formed between the gate electrode G and the semiconductor substrate 201 is a gate insulating film 202 or a Schottky barrier layer. The semiconductor substrate 201 has a p-type conductivity. A source region 203 and a drain region 204 which are areas doped heavily with n-type impurities are formed underneath the source electrode S and drain electrode D of the semiconductor substrate 201, respectively. A channel 205 which is an n-type region is pre-formed between the source region 203 and the drain region 204.

Generally, the substrate voltage Vsub is set equal to or lower than the source voltage Vs and the drain voltage Vd.

As shown in FIGS. 3 and 4, the channel 205 is pre-formed in the depletion type FET as constructed above, so that a drain current Id flows even when the gate-source voltage Vgs is 0 V. And, if the gate-source voltage Vgs is a negative voltage, this forms a depletion layer 206 in the channel 205. As a result, the drain current decreases. As the gate-source voltage Vgs is further reduced, the depletion layer expands and, finally, the channel 205 is cut off. The gate-source voltage Vgs, at which the channel 205 is cut off, is a gate threshold voltage Vth. On the other hand, if the gate-source voltage Vgs is a positive voltage and is increased, this forms an inversion layer in a p-type region of the substrate 201, thereby expanding the channel region. As the result of this, the drain current increases.

Therefore, the depletion type FET is turned off when a voltage Vgsl which is lower than the gate threshold voltage Vth is applied thereto as the gate-source voltage Vgs. On the other hand, the depletion type FET is turned on when a voltage Vgsh which is higher than the gate threshold voltage Vth is applied thereto as the gate-source voltage Vgs.

Next, the operation of the switching device 10 will be described.

Referring to FIGS. 1, 3, and 4, the FETs 111 and 121 of the present embodiment have a gate threshold voltage Vth which is higher than −1.0 V and lower than 0.0 V. And, the bias voltage Vb1 is set to 0.0 V which is a ground potential. On the other hand, the bias voltage Vb2 is set to 1.0 V which is a power supply voltage. Further, as the control voltage Vc, two different voltage values, namely 0.0 V corresponding to the bias voltage Vb1 and 1.0 V corresponding to the bias voltage Vb2, are applied in an alternating manner. Hereinafter, the higher of the two voltage values of the control voltage Vc is called the voltage "Vch", and the lower voltage value is called the voltage "Vcl".

If 0.0 V (Vcl) is applied as the control voltage Vc, in the FET 111, the source voltage Vs becomes 0.0 V, so that the gate-source voltage Vgs becomes 0.0 V (Vgsh). As a result, the gate-source voltage Vgs becomes higher than the gate threshold voltage Vth, so that the FET 111 enters the conductive state.

Meanwhile, in the FET 112, the gate voltage Vg becomes 0.0 V, so that the gate-source voltage Vgs becomes −1.0 V (Vgsl). As a result, the gate-source voltage Vgs becomes lower than the gate threshold voltage Vth, so that the FET 112 enters the cutoff state.

Hereby, the terminals P1 and P2 are electrically connected to each other by the FET switch 11. Stated another way, when the control voltage Vc is 0.0 V (Vcl), the switching device 10 is placed in the first connection state.

Next, if 1.0 V (Vch) is applied as the control voltage Vc, in the FET 111, the source voltage Vs becomes 1.0 V, so that the gate-source voltage Vgs becomes −1.0 V (Vgsl). As a result, the gate-source voltage Vgs becomes lower than the gate threshold voltage Vth, so that the FET 111 enters the cutoff state.

Meanwhile, in the FET 112, the gate voltage Vg becomes 1.0 V, so that the gate-source voltage Vgs becomes 0.0 V (Vgsh). As a result, the gate-source voltage Vgs becomes higher than the gate threshold voltage Vth, so that the FET 112 enters the conductive state.

Hereby, the terminals P1 and P3 are electrically connected to each other by the FET switch 12. Stated another way, when the control voltage Vc is 1.0 V (Vch), the switching device 10 is placed in the second connection state.

Next, the transmission path switching characteristics of the switching device 10 will be described below.

Figure 5A:
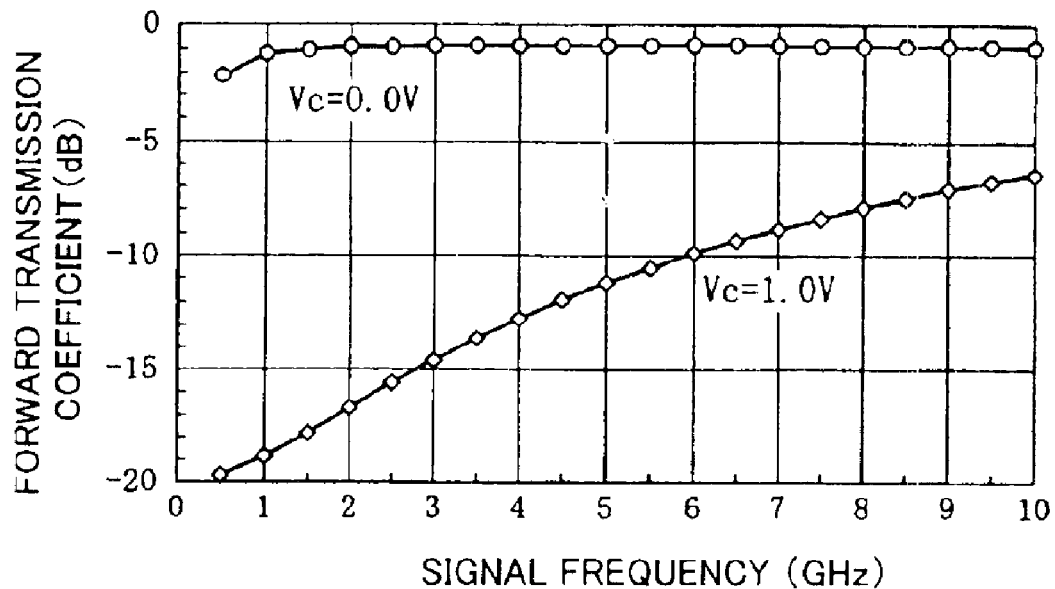
FIGS. 5A and 5B are graphs showing the switching characteristics of the FET switches of FIGS. 2A and 2B.
Figure 5B:
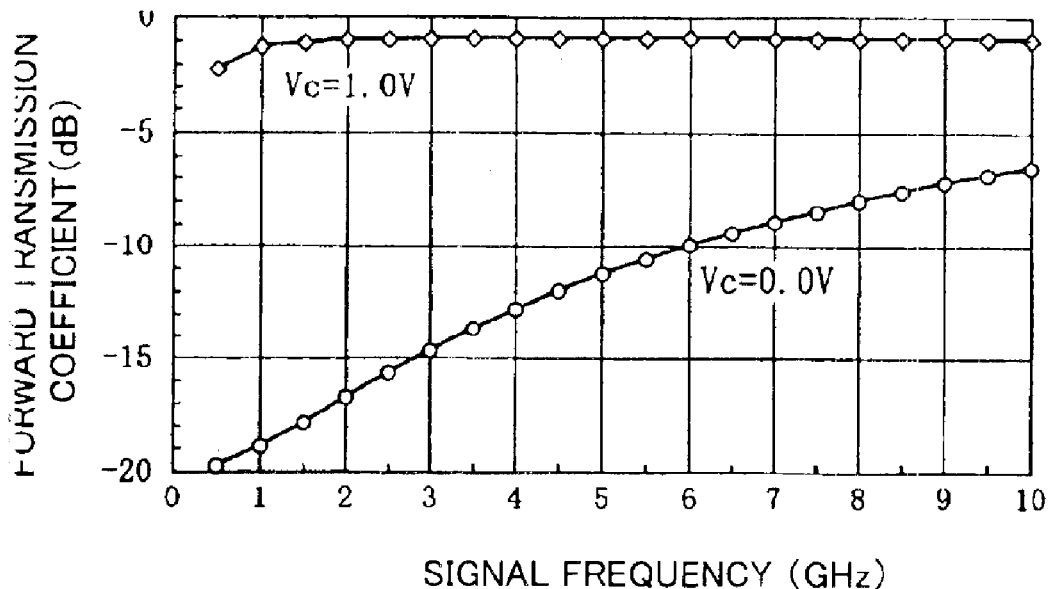

FIGS. 5A and 5B are graphs representing the switching characteristics of the FET switches 11 and 12 in the case where the bias voltage Vb1 is at the ground potential level (0.0 V), the bias voltage Vb2 is the same as the power supply voltage (1.0 V), and the control voltage Vc is either one of two values, namely 0.0 V corresponding to the bias voltage Vb1 and 1.0 V corresponding to the bias voltage Vb2. In the graphs, the vertical axis represents the signal level when signals are transmitted from the terminal P1 to the terminal P2 (the forward transmission coefficient) and the unit is dB. And, the horizontal axis represents the signal frequency and the unit is GHz.

Referring to FIG. 5A, there is shown the switching characteristics of the FET switch 11. In the FET switch 11, the source and the drain are electrically connected to each other when the control voltage Vc is 0.0 V, and, on the other hand, when the control voltage Vc is 1.0 V, the source and the drain are electrically disconnected from each other. Referring to FIG. 5B, there is shown the switching characteristics of the FET switch 12. On the contrary to the FET switch 11, in the FET switch 12, the source and the drain are electrically disconnected from each other when the control voltage Vc is 0.0 V, and, on the other hand, when the control voltage Vc is 1.0 V, the source and the drain are electrically connected to each other. FIGS. 5A and 5B show the switching characteristics when the resistance value of each of the resistor elements 112, 113, 122, and 123 is 5 k$\Omega$; however, there are no great variations in the switching characteristics even when the resistance value is about 500 $\Omega$. Additionally, it is possible to employ a resistance value of about 100 $\Omega$, depending on the specifications of the FETs 111 and 121.

In the switching device 10 of the present embodiment, one ends of the FET switches 11 and 12 having the above-described characteristics are connected to each other via a pair of direct-current blocking capacitive elements Cb and the connection point is the terminal P1. The other ends of the FET switches 11 and 12 are the terminals P2 and P3. It is arranged such that the common control voltage Vc is applied to the FETs 111 and 121.

Figure 6A:
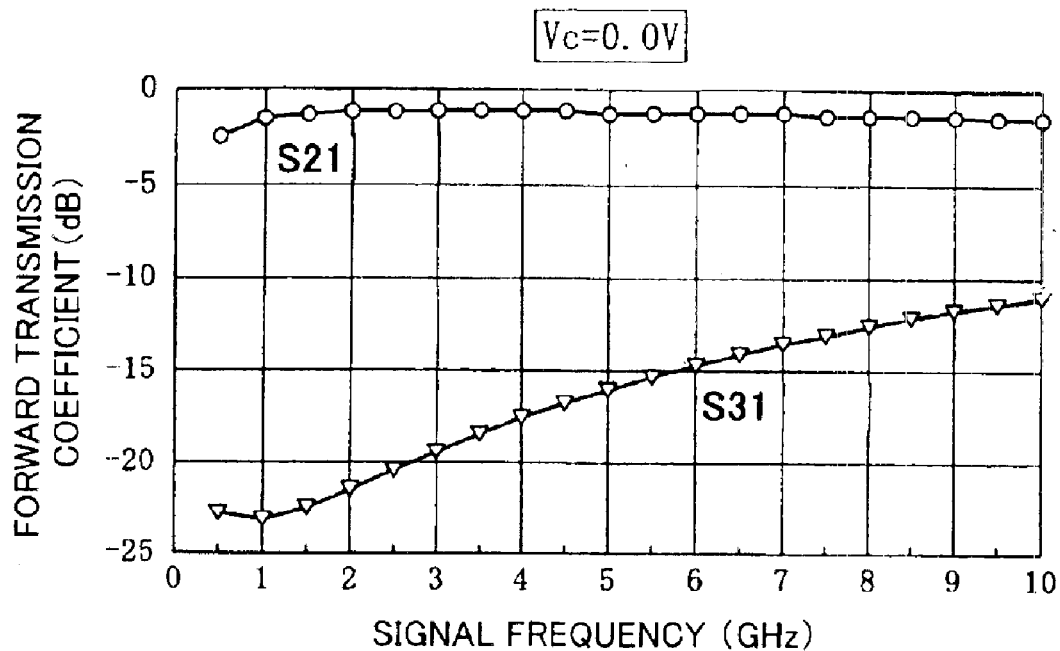
FIGS. 6A and 6B are graphs showing the switching characteristics and reflection characteristics of the switching device of FIG. 1.
Figure 6B:
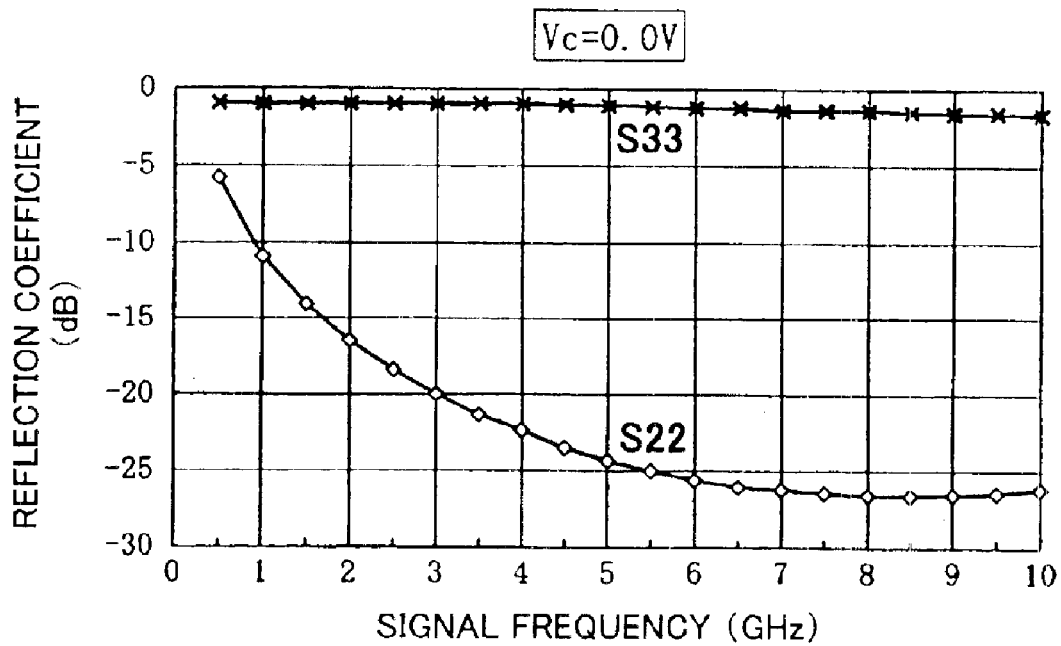

FIGS. 6A and 6B are graphs representing the various characteristics of the switching device 10 when the control voltage Vc is 0.0 V. In the graphs, the horizontal axis represents the signal frequency. Referring to FIG. 6A, there are shown the transmission characteristics of a signal from the terminal P1 to the terminal P2 (the forward transmission coefficient: S21) and the transmission characteristics of a signal from the terminal P1 to the terminal P3 (the forward transmission coefficient: S31). Referring to FIG. 6B, there are shown the reflection characteristics at the terminal P2 (the reflection coefficient: S22) and the reflection characteristics at the terminal P3 (the reflection coefficient: S33). In FIGS. 6A and 6B, the unit of the vertical axis is dB and the unit of the horizontal axis is GHz. The transmission characteristics represented in FIG. 6A clearly show that the terminals P1 and P2 are being connected to each other, and the terminals P1 and P3 are being disconnected from each other.

Figure 7A:
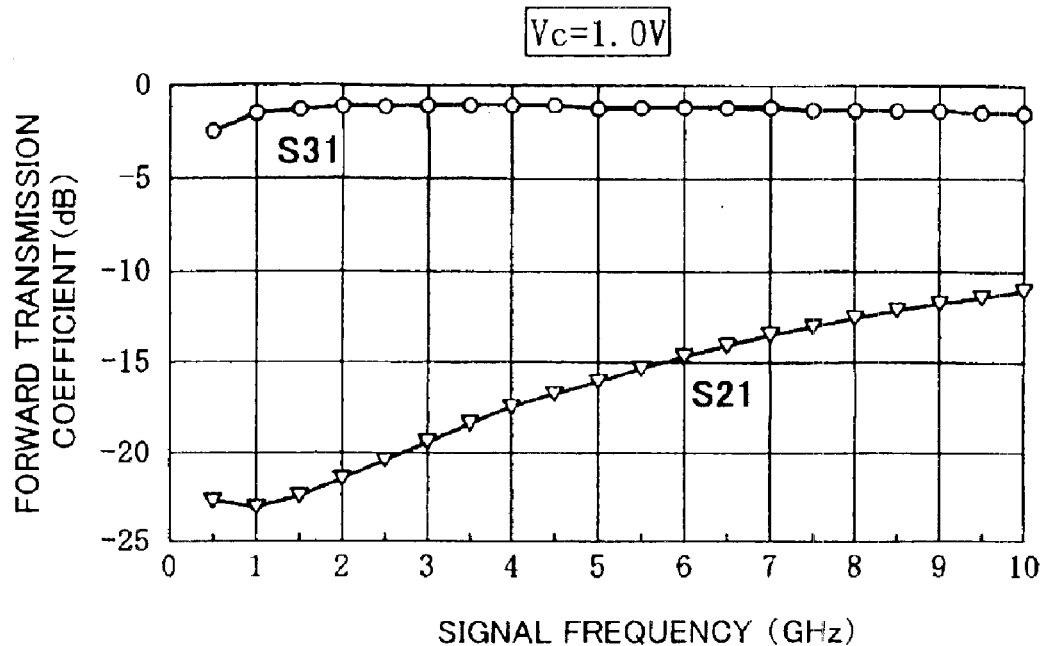
FIGS. 7A and 7B are graphs showing the switching characteristics and reflection characteristics of the switching device of FIG. 1.
Figure 7B:
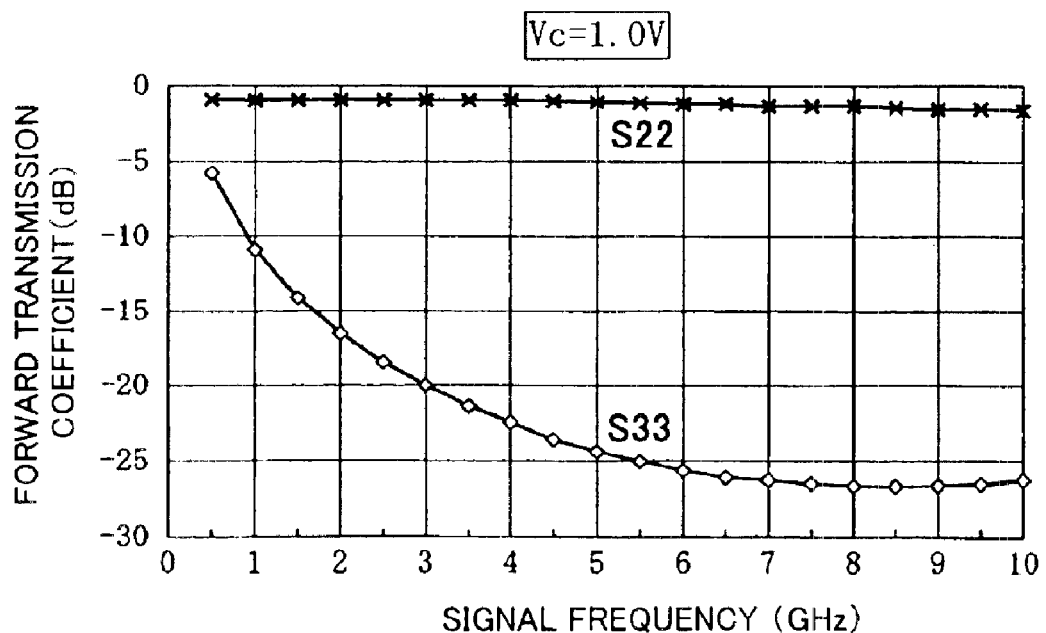

FIGS. 7A and 7B are graphs representing the various characteristics of the switching device 10 when the control voltage Vc is 1.0 V. In the graphs, the horizontal axis represents the signal frequency. Referring to FIG. 7A, there are shown the transmission characteristics of a signal from the terminal P1 to the terminal P2 (the forward transmission coefficient: S21) and the transmission characteristics of a signal from the terminal P1 to the terminal P3 (the forward transmission coefficient: S31). Referring to FIG. 7B, there are shown the reflection characteristics at the terminal P2 (the reflection coefficient: S22) and the reflection characteristics at the terminal P3 (the reflection coefficient: S33). In FIGS. 7A and 7B, the unit of the vertical axis and the unit of the horizontal axis are the same as in FIGS. 6A and 6B. The transmission characteristics represented in FIG. 6A clearly show that the terminals P1 and P2 are in a disconnection relationship, and the terminals P1 and P3 are in a connection relationship.

It is hard to say that that the reflection characteristics: S33 shown in FIG. 6B and the reflection characteristics: S22 shown in FIG. 7B are at satisfactory levels. Measures for achieving improvements in the reflection characteristics will be described later.

As has been described above, in the present embodiment, the FET switches 11 and 12 provided with the FETs 111 and 121 formed by HEMTs or HFETs can operate in a complementary switching manner with the single control voltage Vc to thereby establish the first and second connection states in a complementary manner. In addition, the bias voltages Vb1 and Vb2 and the control voltage Vc are all not less than the ground potential and, therefore, the switching device 10 is able to operate only by a positive power supply. This eliminates the need for the provision of a negative power supply for supplying a negative voltage, thereby leading to a reduction in circuit scale.

It should be noted that the FETs 111 and 121 are not limited to HEMTs or HFETs. The FETs 111 and 121 may be implemented by FETs having a different configuration. Methods of setting the bias voltages Vb1 and Vb2 and the control voltage Vc in this case will be described below in detail.

In the above description, there is illustrated a concrete example method of setting the bias voltages Vb1 and Vb2 and the control voltage Vc in the case where the first and second FETs 111 and 121 are implemented by n-channel depletion type FETs and both the FETs 111 and 121 have substantially the same gate threshold voltage Vth. On the other hand, general methods of setting the bias voltages Vb1 and Vb2 and the control voltage Vc will be explained for the case where the FETs 111 and 121 are formed by n-channel depletion type FETs, for the case where the FETs 111 and 121 are formed by p-channel depletion type FETs, for the case where the FETs 111 and 121 are formed by n-channel enhancement type FETs, and for the case where the FETs 111 and 121 are formed by p-channel enhancement type FETs.

First, the Id-Vgs characteristics of the FETs other than the n-channel depletion type will be explained as a precondition.

Figure 8A:
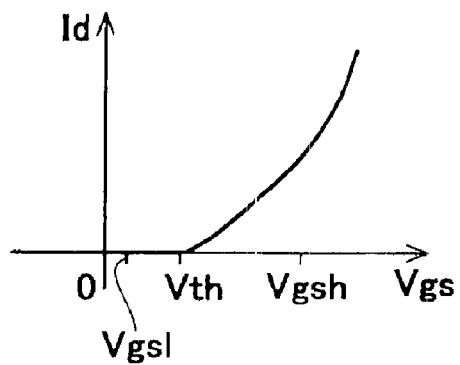
Figure 8B:
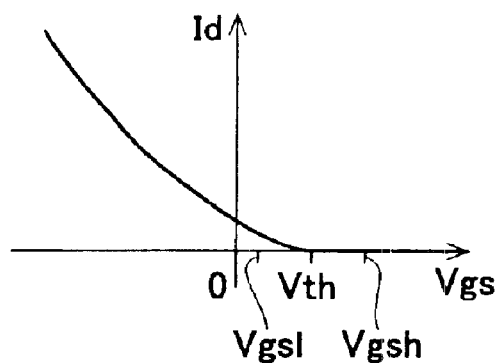
Figure 8C:
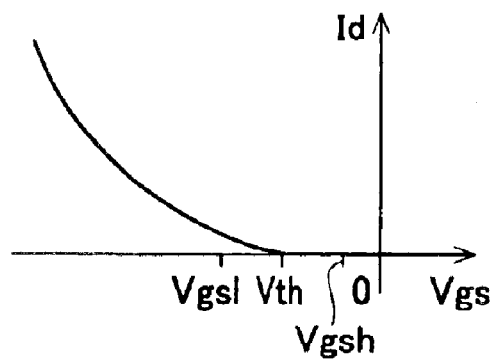

FIGS. 8A–C are graphs representing the Id-Vgs characteristics of the FETs other than the n-channel depletion type. More specifically, FIG. 8A is a graph showing the Id-Vgs characteristics of an n-channel enhancement type FET, FIG. 8B is a graph showing the Id-Vgs characteristics of a p-channel depletion type FET, and FIG. 8C is a graph showing the Id-Vgs characteristics of a p-channel enhancement type FET.

As can be seen from FIG. 8A, the Id-Vgs characteristics of the n-channel enhancement type FET are the same as the Id-Vgs characteristics of the n-channel depletion type FET (see FIG. 4), with the exception that the gate threshold voltage Vth is a positive voltage.

In the Id-Vgs characteristics of the p-channel depletion type FET shown in FIG. 8B, the gate threshold voltage Vth is a positive voltage and the drain current Id increases as the gate-source voltage Vgs decreases. Accordingly, the Id-Vgs characteristics of the p-channel depletion type FET differs from the Id-Vgs characteristics of the n-channel depletion type FET in that the polarity of the gate threshold voltage Vgs and the variation in the drain current Id with respect to the gate-source voltage Vgs become reversed.

In the Id-Vgs characteristics of the p-channel enhancement type FET shown in FIG. 8C, the gate threshold voltage Vth is a negative voltage, and the drain current Id increases as the gate-source voltage Vgs decreases. Accordingly, although the polarity of the gate threshold voltage Vgs is the same as the n-channel depletion type FET, the Id-Vgs characteristics of the p-channel enhancement type FET differs from the Id-Vgs characteristics of the n-channel depletion type FET in that the variation in the drain current Id with respect to the gate-source voltage Vgs becomes reversed.

Hereinafter, methods of setting the bias voltages Vb1 and Vb2 and the control voltage Vc will be described.

n-Channel Depletion Type

Firstly, the n-channel depletion type FET will be described.

Figure 9A:
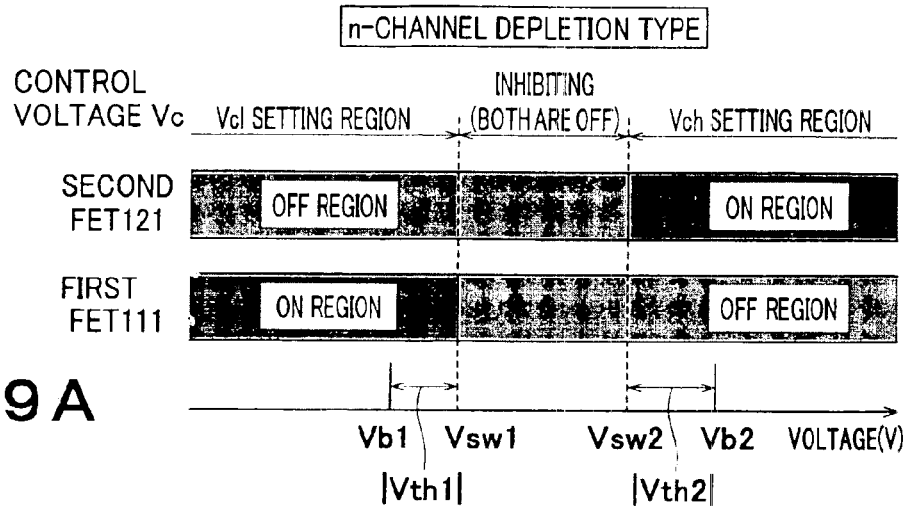
Figure 9B:
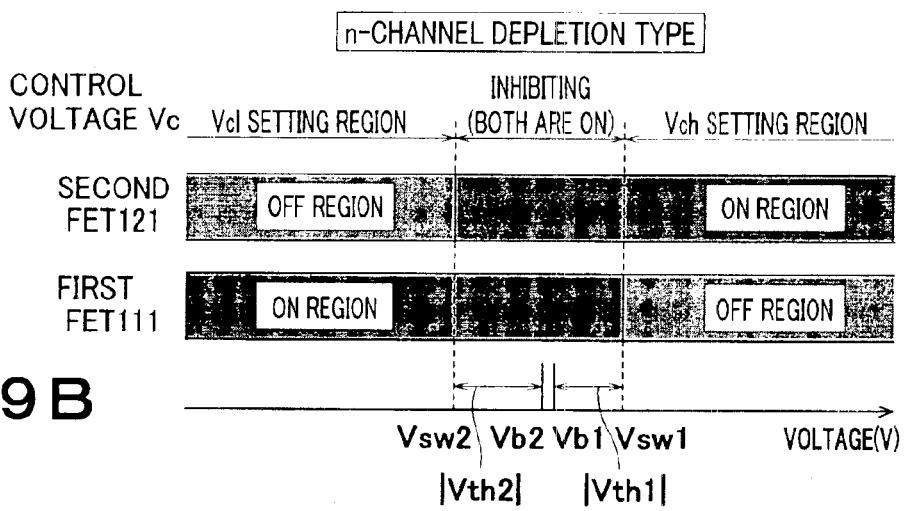
Figure 9C:
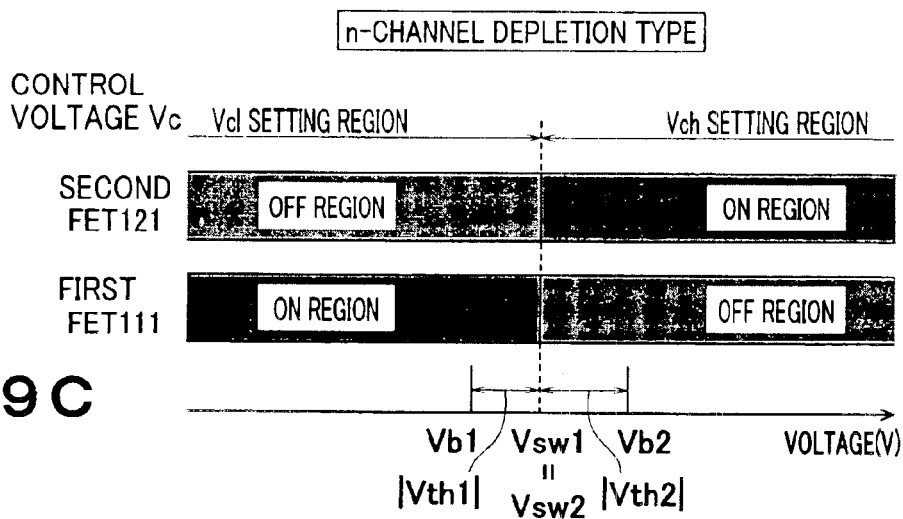

FIGS. 9A–C illustrate methods of setting a control voltage in the n-channel depletion type FET. More specifically, FIG. 9A is an illustration showing a control voltage setting method in the case where the ON-OFF switching voltage of the first FET is lower than the ON-OFF switching voltage of the second FET. FIG. 9B is an illustration showing a control voltage setting method in the case where the ON-OFF switching voltage of the first FET is higher than the ON-OFF switching voltage of the second FET. FIG. 9C is an illustration showing a control voltage setting method in the case where the ON-OFF switching voltage of the first FET agrees with the ON-OFF switching voltage of the second FET. In each of FIGS. 9A–C, the horizontal axis represents the voltage with respect to the ground potential.

Referring to FIG. 1, the first FET 111 is defined as a FET which is fed a bias voltage (Vb1) and a control voltage (Vc) at its gate and source, respectively. On the other hand, the second FET 121 is defined as a FET which is fed a bias voltage (Vb2) and a control voltage (Vc) at its source and gate, respectively.

The source voltage at which the first FET 111 is switched between ON state (the conductive state) and the OFF state (the cutoff state) is defined as an ON-OFF switching voltage Vsw1 of the first FET 111.

Furthermore, the gate voltage at which the second FET 121 is switched the ON state and the OFF state is defined as an ON-OFF switching voltage Vsw2 of the second FET 121.

The gate threshold voltage of the first FET 111 is Vth1 and the gate threshold voltage of the second FET 121 is Vth2.

In this case, the ON-OFF switching voltage Vsw1 of the first FET 111 is [the gate threshold voltage Vth1]=[the gate voltage: the bias voltage Vb1]−[the source voltage: the ON-OFF switching voltage Vsw1], so that:

$Vsw1 = Vb1 - Vth1 = Vb1 + |Vth1|$.

On the other hand, the ON-OFF switching voltage Vsw2 of the second FET 121 is [the gate threshold voltage Vth2]=[the gate voltage: the ON-OFF switching voltage Vsw2]−[the source voltage: the bias voltage Vb2], so that:

$Vsw2 = Vb2 + Vth2 = Vb2 - |Vth2|$.

Here, there are three different combinations (a)–(c) of the ON-OFF switching voltage Vsw1 of the first FET 111 and the ON-OFF switching voltage Vsw2 of the second FET 121. In the first combination case (a), the ON-OFF switching voltage Vsw1 of the first FET 111 is lower than the ON-OFF switching voltage Vsw2 of the second FET 121. In the second combination case (b), the ON-OFF switching voltage Vsw1 of the first FET 111 is higher than the ON-OFF switching voltage Vsw2 of the second FET 121. In the third combination case (c), the ON-OFF switching voltage Vsw1 of the first FET 111 agrees with the ON-OFF switching voltage Vsw2 of the second FET 121.

Combination Case (a)

As shown in FIG. 9A, in the first FET 111, the voltage range in which the source voltage does not exceed the ON-OFF switching voltage Vsw1 is an ON region, and the voltage range in which the source voltage exceeds the ON-OFF switching voltage Vsw1 is an OFF region. On the other hand, in the second FET 121, the voltage range in which the gate voltage exceeds the ON-OFF switching voltage Vsw2 is an ON region, and the voltage range in which the source voltage does not exceed the ON-OFF switching voltage Vsw2 is an OFF region.

Here, the control voltage Vc corresponds to the source voltage in the first FET 111 and to the gate voltage in the second FET 121. Accordingly, in the voltage range in which the control voltage Vc does not exceed the ON-OFF switching voltage Vsw1 of the first FET 111, the first FET 111 is turned on while the second FET 121 is turned off. Therefore, this voltage range becomes a region (hereinafter referred to as the "Vcl setting region) in which the lower of the two values of the control voltage Vc, i.e., the voltage value Vcl, is to be set. On the other hand, in the voltage range in which the control voltage Vc exceeds the ON-OFF switching voltage Vsw2 of the second FET 121, the first FET 111 is turned off while the second FET 121 is turned on. Therefore, this voltage range becomes a region (hereinafter referred to as the "Vch setting region) in which the higher of the two values of the control voltage Vc, i.e., the voltage value Vch, is to be set. In addition, in the voltage range in which the control voltage Vc exceeds the ON-OFF switching voltage Vsw1 of the first FET 111 but does not exceed the ON-OFF switching voltage Vsw2 of the second FET 121, both the first FET 111 and the second FET 121 are turned off. Therefore, this voltage range becomes a setting inhibiting region of the control voltage Vc.

Stated another way, it suffices if (a) the bias voltage Vb2 is set higher than the bias voltage Vb1, (b) the lower voltage value Vcl of the control voltage Vc is set so as not to exceed the voltage (Vsw1) which is higher than the bias voltage Vb1 by the absolute value of the gate threshold voltage Vth1 of the first FET 111, and (c) the higher voltage value Vch of the control voltage Vc is set so as to exceed the voltage (Vsw2) which is lower than the bias voltage Vb2 by the absolute value of the gate threshold voltage Vth2 of the second FET 121. As a result of such settings, the first FET 111 and the second FET 121 operate in a complementary switching manner with the single control voltage Vc.

Furthermore, if the bias voltage Vb1, the bias voltage Vb2, and the control voltage Vc (more properly, Vcl) are all set to above the ground potential, the switching device 10 requires only a positive power supply for its operations.

Combination Case (b)

As shown in FIG. 9B, in the voltage range in which the control voltage Vc does not exceed the ON-OFF switching voltage Vsw2 of the second FET 121, the first FET 111 is turned on while the second FET 121 is turned off.

Accordingly, this voltage range becomes a Vcl setting region of the control voltage Vc. Additionally, in the voltage range in which the control voltage Vc exceeds the ON-OFF switching voltage Vsw1 of the first FET 111, the first FET 111 is turned off while the second FET 121 is turned on. Accordingly, this voltage range becomes a Vch setting region of the control voltage Vc. And, in the voltage range in which the control voltage Vc exceeds the ON-OFF switching voltage Vsw2 of the second FET 121 but does not exceed the ON-OFF switching voltage Vsw1 of the first FET 111, both the first FET 111 and the second FET 121 are turned on. Therefore, this voltage range becomes a setting inhibiting region of the control voltage Vc.

The bias voltage Vb1 is lower than the bias voltage Vb2 in a range in which the ON-OFF switching voltage Vsw2 of the second FET 121 and the ON-OFF switching voltage Vsw1 of the first FET 111 are approximate in value. The bias voltage Vb1 and the bias voltage Vb2 agree with each other in the case where the difference in voltage between the ON-OFF switching voltage Vsw2 of the second FET 121 and the ON-OFF switching voltage Vsw1 of the first FET 111 is a given value. The bias voltage Vb1 is higher than the bias voltage Vb2 in a range in which the ON-OFF switching voltage Vsw2 of the second FET 121 and the ON-OFF switching voltage Vsw1 of the first FET 111 are greatly different in value (see FIG. 9B). In other words, in this case, either one of the bias voltage Vb1 and the bias voltage Vb2 can be set higher than the other.

And, it suffices if (a) the lower voltage value Vcl of the control voltage Vc is set so as not to exceed the voltage (Vsw2) which is lower than the bias voltage Vb2 by the absolute value of the gate threshold voltage Vth2 of the second FET 121 and (b) the higher voltage value Vch of the control voltage Vc is set so as to exceed the voltage (Vsw1) which is higher than the bias voltage Vb1 by the absolute value of the gate threshold voltage Vth1 of the first FET 111. Other setting conditions are the same as the combination case (a).

Combination Case (c)

As shown in FIG. 9C, in the voltage range in which the control voltage Vc exceeds neither the ON-OFF switching voltage Vsw1 of the first FET 111 nor the ON-OFF switching voltage Vsw2 of the second FET 121, the first FET 111 is turned on while the second FET 121 is turned off. Accordingly, this voltage range becomes a Vcl setting region of the control voltage Vc. On the other hand, in a voltage range in which the control voltage Vc exceeds both the ON-OFF switching voltage Vsw1 of the first FET 111 and the ON-OFF switching voltage Vsw2 of the second FET 121, the first FET 111 is turned off while the second FET 121 is turned on. Accordingly, this voltage range becomes a Vch setting region of the control voltage Vc. There exists no region in which both the first FET 111 and the second FET 121 are turned on or off at the same time, so that there exists no setting inhibiting region of the control voltage Vc.

And, the bias voltage Vb2 becomes higher than the bias voltage Vb1.

Other setting conditions are the same as the combination case (a).

SUMMARY

To sum up the above-described three combination cases, setting conditions necessary for the first FET 111 and the second FET 121 to operate in a complementary switching manner with the single control voltage Vc are as follows.

The bias voltage Vb1 and the bias voltage Vb2 may be set arbitrarily.

It suffices if (a) the lower voltage value Vcl of the control voltage Vc is set lower than both the voltage (Vsw1) which is higher than the bias voltage Vb1 by the absolute value of the gate threshold voltage Vth1 of the first FET 111 and the voltage (Vsw2) which is lower than the bias voltage Vb2 by the absolute value of the gate threshold voltage Vth2 of the second FET 121 and (b) the higher voltage value Vch of the control voltage Vc is set higher than both the voltage (Vsw1) which is higher than the bias voltage Vb1 by the absolute value of the gate threshold voltage Vth1 of the first FET 111 and the voltage (Vsw2) which is lower than the bias voltage Vb2 by the absolute value of the gate threshold voltage Vth2 of the second FET 121.

Additionally, in order that the switching device 10 can be operated only by a positive power supply, it suffices if the bias voltage Vb1, the bias voltage Vb2, and the control voltage Vc are all set to above the ground potential, in addition to meeting the above-described conditions.

p-Channel Depletion Type

Hereinafter, the p-channel depletion type FET will be described.

Figure 10A:
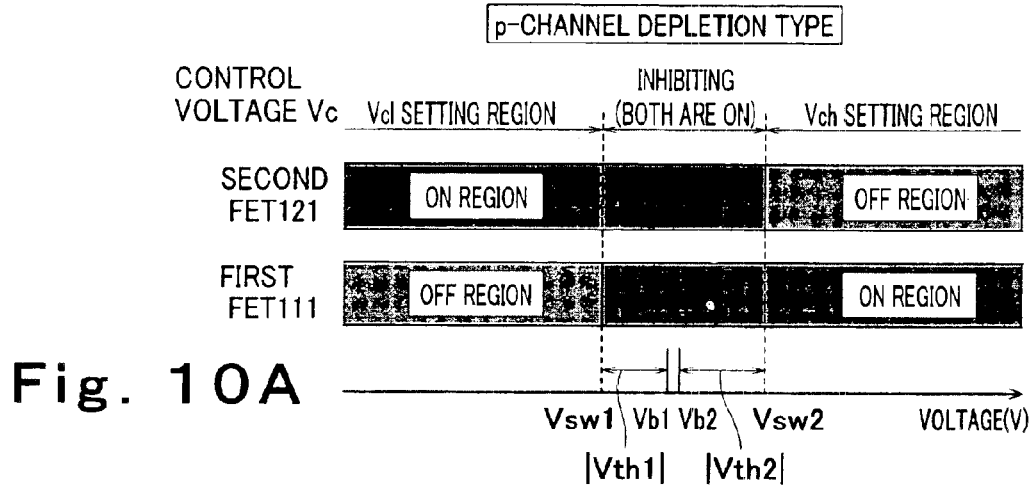
Figure 10B:
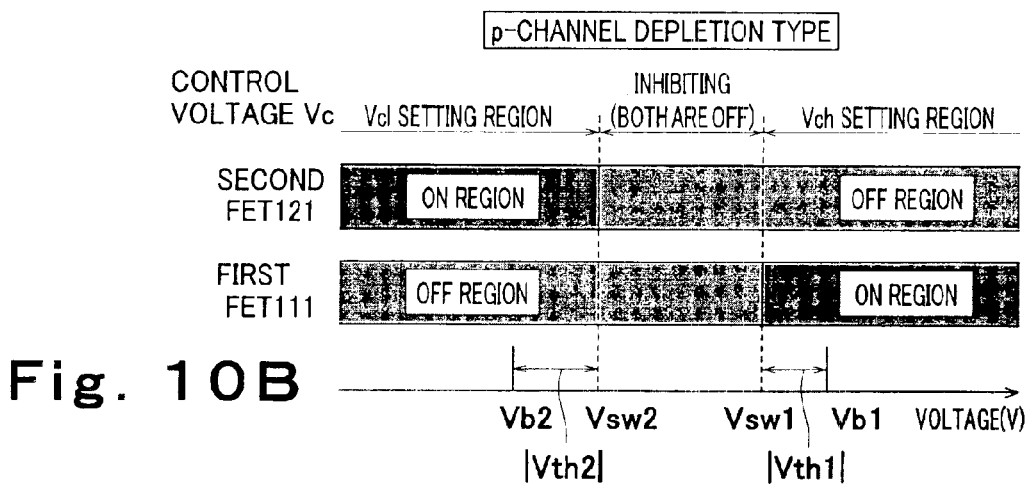
Figure 10C:
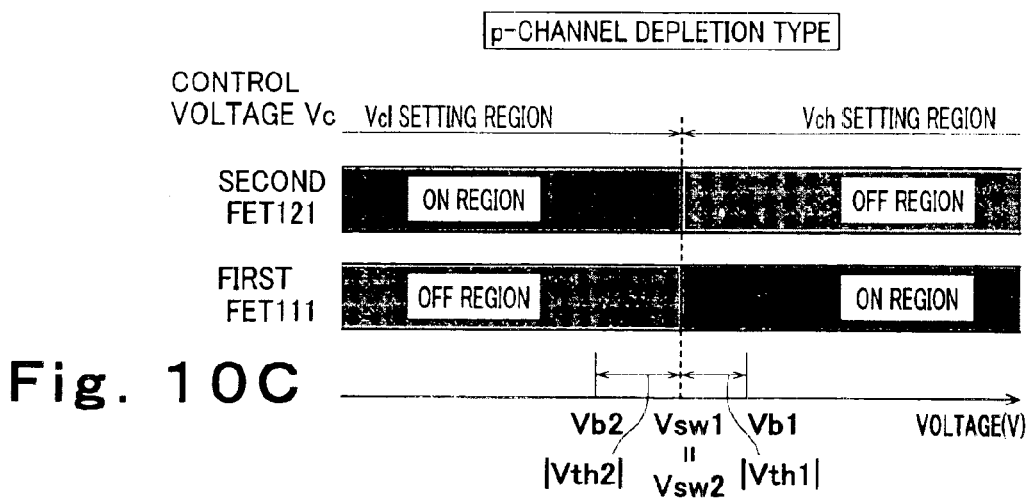

FIGS. 10A–C illustrate methods of setting a control voltage in the p-channel depletion type FET. More specifically, FIG. 10A is an illustration showing a control voltage setting method in the case where the ON-OFF switching voltage of the first FET is lower than the ON-OFF switching voltage of the second FET. FIG. 10B is an illustration showing a control voltage setting method in the case where the ON-OFF switching voltage of the first FET is higher than the ON-OFF switching voltage of the second FET. FIG. 10C is an illustration showing a control voltage setting method in the case where the ON-OFF switching voltage of the first FET agrees with the ON-OFF switching voltage of the second FET. In each of FIGS. 10A–C, the horizontal axis represents the voltage with respect to the ground potential.

For the case of the p-channel depletion type FET, as can be seen clearly from comparison between FIGS. 10A–C and FIGS. 9A-C, the ON-OFF switching voltage Vsw1 of the first FET 111 is expressed by: Vsw1=Vb1−Vth1=Vb1−|Vth1|, and the ON-OFF switching voltage Vsw2 of the second FET 121 is expressed by: Vsw2 =Vb2+Vth2=Vb2+|Vth2|.

And, in the first FET 111, the voltage range in which the source voltage exceeds the ON-OFF switching voltage Vsw1 becomes an ON region, and the voltage range in which the source voltage does not exceed the ON-OFF switching voltage Vsw1 becomes an OFF region. On the other hand, in the second FET 121, the voltage range in which the gate voltage does not exceed the ON-OFF switching voltage Vsw2 becomes an ON region, and the voltage range in which the source voltage exceeds the ON-OFF switching voltage Vsw2 becomes an OFF region. Accordingly, in the Vcl setting region, the first FET 111 is turned off while the second FET 121 is turned on, and in the Vch setting region the first FET 111 is turned on while the second FET 121 is turned off.

Other respects are the same as in the n-channel depletion type FET. Accordingly, setting conditions necessary for the first FET 111 and the second FET 121 to operate in a complementary switching manner with the single control voltage Vc are as follows.

The bias voltage Vb1 and the bias voltage Vb2 may be set arbitrarily.

It suffices if (a) the lower voltage value Vcl of the control voltage Vc is set lower than both the voltage (Vsw1) which is lower than the bias voltage Vb1 by the absolute value of the gate threshold voltage Vth1 of the first FET 111 and the voltage (Vsw2) which is higher than the bias voltage Vb2 by the absolute value of the gate threshold voltage Vth2 of the second FET 121 and (b) the higher voltage value Vch of the control voltage Vc is set higher than both the voltage (Vsw1) which is lower than the bias voltage Vb1 by the absolute value of the gate threshold voltage Vth1 of the first FET 111 and the voltage (Vsw2) which is higher than the bias voltage Vb2 by the absolute value of the gate threshold voltage Vth2 of the second FET 121.

Additionally, in order that the switching device 10 can be operated only by a positive power supply, it suffices if the bias voltage Vb1, the bias voltage Vb2, and the control voltage Vc (more properly, Vcl) are all set to above the ground potential, in addition to meeting the above-described conditions.

n-Channel Enhancement Type

Next, the n-channel enhancement type FET will be described.

Figure 11A:
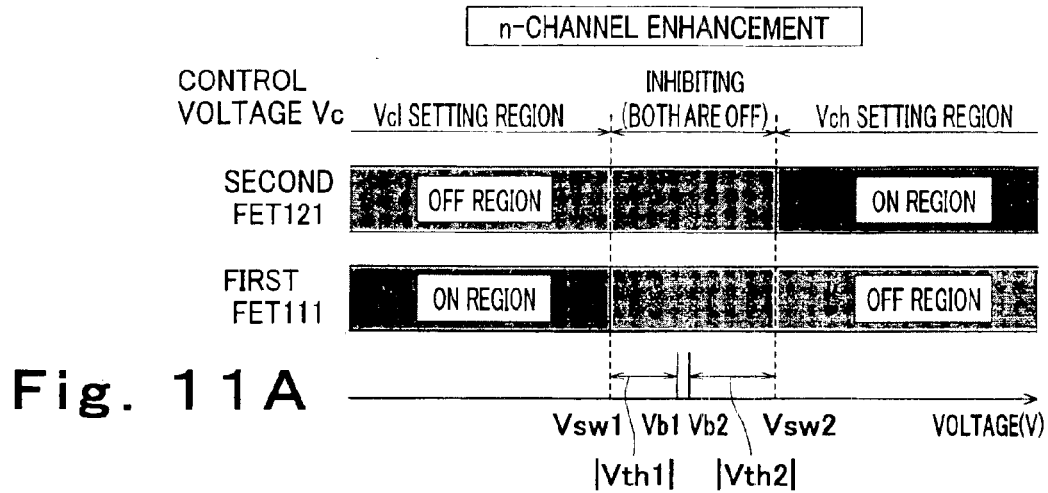
Figure 11B:
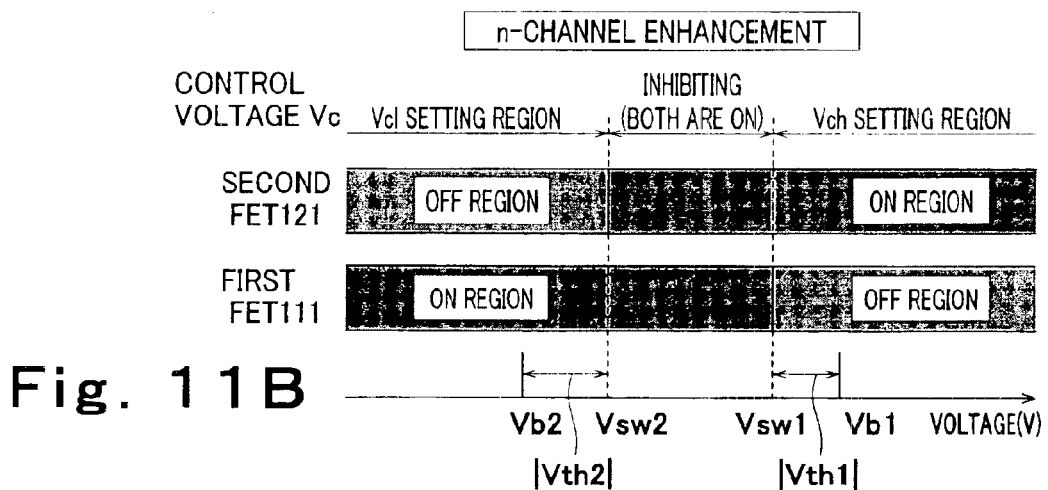
Figure 11C:
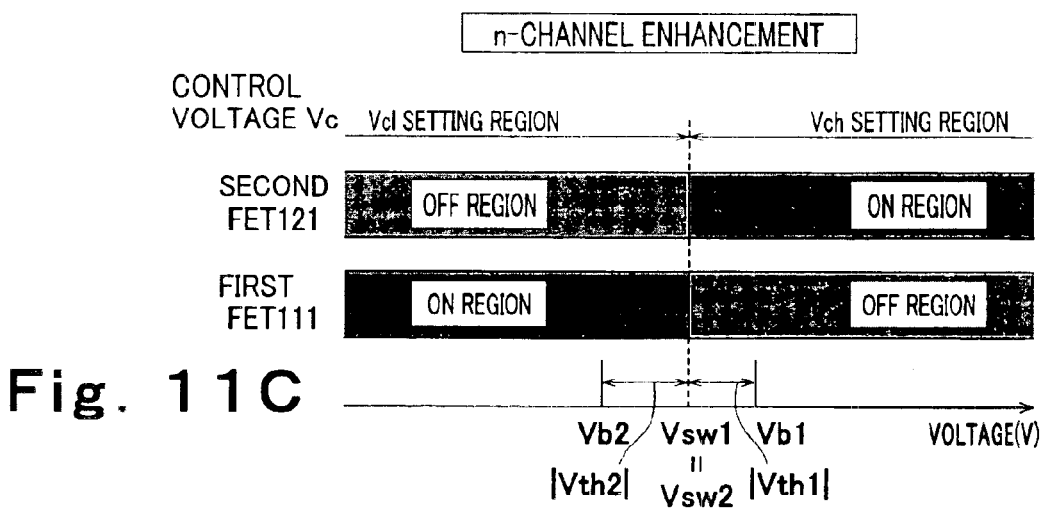

FIGS. 11A–C illustrate methods of setting a control voltage in the n-channel enhancement type FET. More specifically, FIG. 11A is an illustration showing a control voltage setting method in the case where the ON-OFF switching voltage of the first FET is lower than the ON-OFF switching voltage of the second FET. FIG. 11B is an illustration showing a control voltage setting method in the case where the ON-OFF switching voltage of the first FET is higher than the ON-OFF switching voltage of the second FET. FIG. 11C is an illustration showing a control voltage setting method in the case where the ON-OFF switching voltage of the first FET agrees with the ON-OFF switching voltage of the second FET. In each of FIGS. 11A–C, the horizontal axis represents the voltage with respect to the ground potential.

For the case of the n-channel enhancement type FET, as can be seen clearly from comparison between FIGS. 11A–C and FIGS. 9A–C, the ON-OFF switching voltage Vsw1 of the first FET 111 is expressed by: Vsw1=Vb1−Vth1=Vb1−|Vth1|, and the ON-OFF switching voltage Vsw2 of the second FET 121 is expressed by: Vsw2 =Vb2+Vth2=Vb2+|Vth2|.

Other respects are the same as in the n-channel depletion type FET. Accordingly, setting conditions necessary for the first FET 111 and the second FET 121 to operate in a complementary switching manner with the single control voltage Vc are as follows.

The bias voltage Vb1 and the bias voltage Vb2 may be set arbitrarily.

It suffices if (a) the lower voltage value Vcl of the control voltage Vc is set lower than both the voltage (Vsw1) which is lower than the bias voltage Vb1 by the absolute value of the gate threshold voltage Vth1 of the first FET 111 and the voltage (Vsw2) which is higher than the bias voltage Vb2 by the absolute value of the gate threshold voltage Vth2 of the second FET 121 and (b) the higher voltage value Vch of the control voltage Vc is set higher than both the voltage (Vsw1) which is lower than the bias voltage Vb1 by the absolute value of the gate threshold voltage Vth1 of the first FET 111 and the voltage (Vsw2) which is higher than the bias voltage Vb2 by the absolute value of the gate threshold voltage Vth2 of the second FET 121.

Additionally, in order that the switching device 10 can be operated only by a positive power supply, it suffices if the bias voltage Vb1, the bias voltage Vb2, and the control voltage Vc are all set to above the ground potential, in addition to meeting the above-described conditions.

p-Channel Enhancement Type

Next, the p-channel enhancement type FET will be described.

Figure 12A:
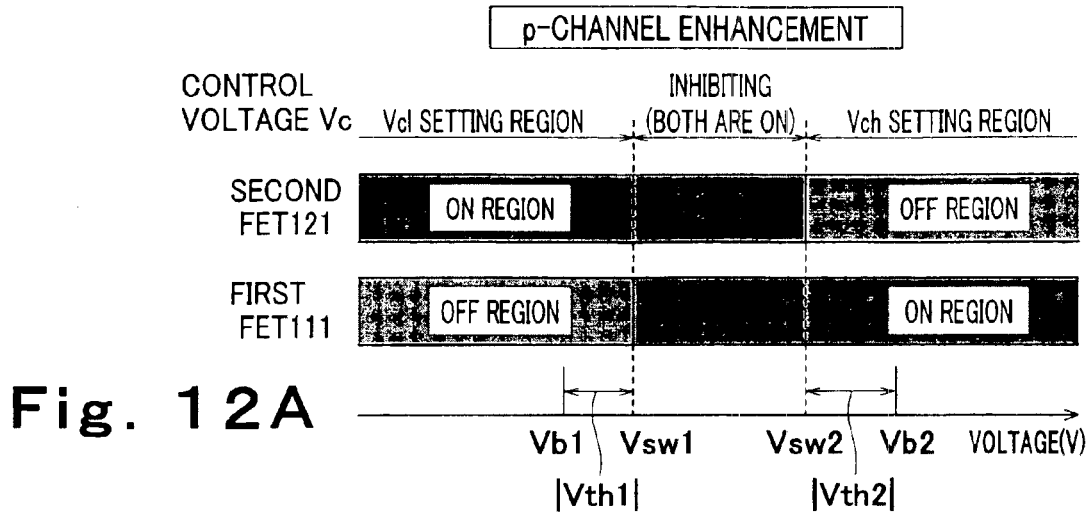
Figure 12B:
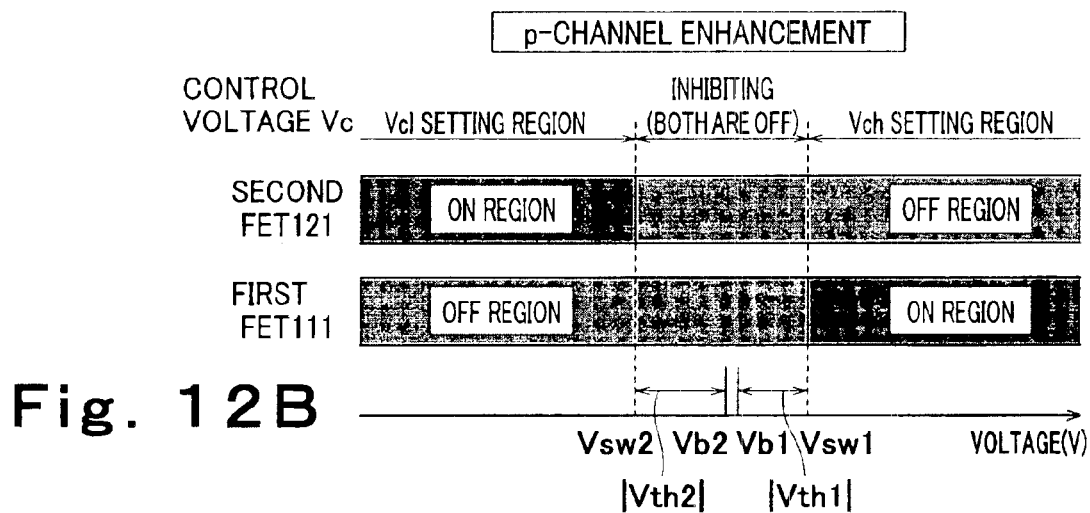
Figure 12C:
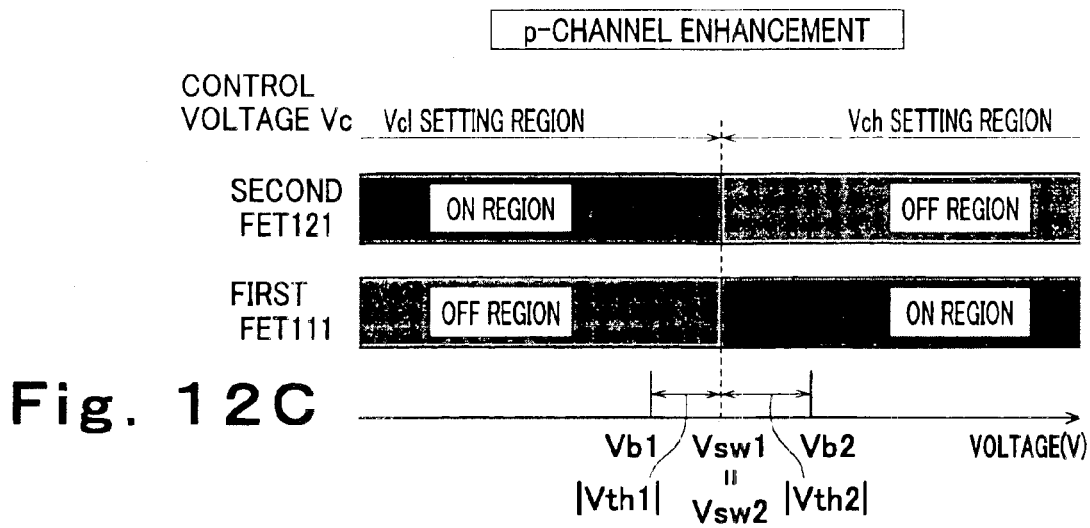

FIGS. 12A–C illustrate methods of setting a control voltage in the p-channel enhancement type FET. More specifically, FIG. 12A is an illustration showing a control voltage setting method in the case where the ON-OFF switching voltage of the first FET is lower than the ON-OFF switching voltage of the second FET. FIG. 12B is an illustration showing a control voltage setting method in the case where the ON-OFF switching voltage of the first FET is higher than the ON-OFF switching voltage of the second FET. FIG. 12C is an illustration showing a control voltage setting method in the case where the ON-OFF switching voltage of the first FET agrees with the ON-OFF switching voltage of the second FET. In each of FIGS. 12A–C, the horizontal axis represents the voltage with respect to the ground potential.

For the case of the p-channel enhancement type FET, as can be seen clearly from comparison between FIGS. 12A–C and FIGS. 9A–C, the ON-OFF switching voltage Vsw1 of the first FET 111 is expressed by: Vsw1=Vb1−Vth1=Vb1+|Vth1|, and the ON-OFF switching voltage Vsw2 of the second FET 121 is expressed by: Vsw2 =Vb2+Vth2=Vb2−|Vth2|.

And, in the first FET 111, the voltage range in which the source voltage exceeds the ON-OFF switching voltage Vsw1 becomes an ON region, and the voltage range in which the source voltage does not exceed the ON-OFF switching voltage Vsw1 becomes an OFF region. On the other hand, in the second FET 121, the voltage range in which the gate voltage does not exceed the ON-OFF switching voltage Vsw2 becomes an ON region, and the voltage range in which the source voltage exceeds the ON-OFF switching voltage Vsw2 becomes an OFF region.

Other respects are the same as in the n-channel depletion type FET. Accordingly, setting conditions necessary for the first FET 111 and the second FET 121 to operate in a complementary switching manner with the single control voltage Vc are as follows.

The bias voltage Vb1 and the bias voltage Vb2 may be set arbitrarily.

It suffices if (a) the lower voltage value Vcl of the control voltage Vc is set lower than both the voltage (Vsw1) which is higher than the bias voltage Vb1 by the absolute value of the gate threshold voltage Vth1 of the first FET 111 and the voltage (Vsw2) which is lower than the bias voltage Vb2 by the absolute value of the gate threshold voltage Vth2 of the second FET 121 and (b) the higher voltage value Vch of the control voltage Vc is set higher than both the voltage (Vsw1) which is higher than the bias voltage Vb1 by the absolute value of the gate threshold voltage Vth1 of the first FET 111 and the voltage (Vsw2) which is lower than the bias voltage Vb2 by the absolute value of the gate threshold voltage Vth2 of the second FET 121.

Additionally, in order that the switching device 10 can be operated only by a positive power supply, it suffices if the bias voltage Vb1, the bias voltage Vb2, and the control voltage Vc are all set to above the ground potential, in addition to meeting the above-described conditions.

SUMMARY OF THE FOUR FET TYPES

When employing the n-channel depletion type FET, the p-channel depletion type FET, the n-channel enhancement type FET, or the p-channel enhancement type FET, setting conditions for the first FET 111 and the second FET 121 to operate in a complementary switching manner with the single control voltage Vc are as follows.

The bias voltage Vb1 and the bias voltage Vb2 may be set arbitrarily.

It suffices if (a) the lower voltage value Vcl of the control voltage Vc is set lower than both the voltage (Vsw1) derived from subtracting the gate threshold voltage Vth1 of the first FET 111 with a sign from the bias voltage Vb1 and the voltage (Vsw2) derived from adding the gate threshold voltage Vth2 of the second FET 121 with a sign to the bias voltage Vb2 and (b) the higher voltage value Vch of the control voltage Vc is set higher than both the voltage (Vsw1) derived from subtracting the gate threshold voltage Vth1 of the first FET 111 with a sign from the bias voltage Vb1 and the voltage (Vsw2) derived from adding the gate threshold voltage Vth2 of the second FET 121 with a sign to the bias voltage Vb2.

Additionally, in order that the switching device 10 can be operated only by a positive power supply, it suffices if the bias voltage Vb1, the bias voltage Vb2, and the control voltage Vc are all set to above the ground potential, in addition to meeting the above-described conditions.

Embodiment 2

As described previously, it is hard to say that the reflection characteristic: S33 shown in FIG. 6B and the reflection characteristic: S22 shown in FIG. 7B are at sufficient levels. A second embodiment of the present invention provides a switching device with a view to achieving improvements in the reflection characteristics.

Figure 13:
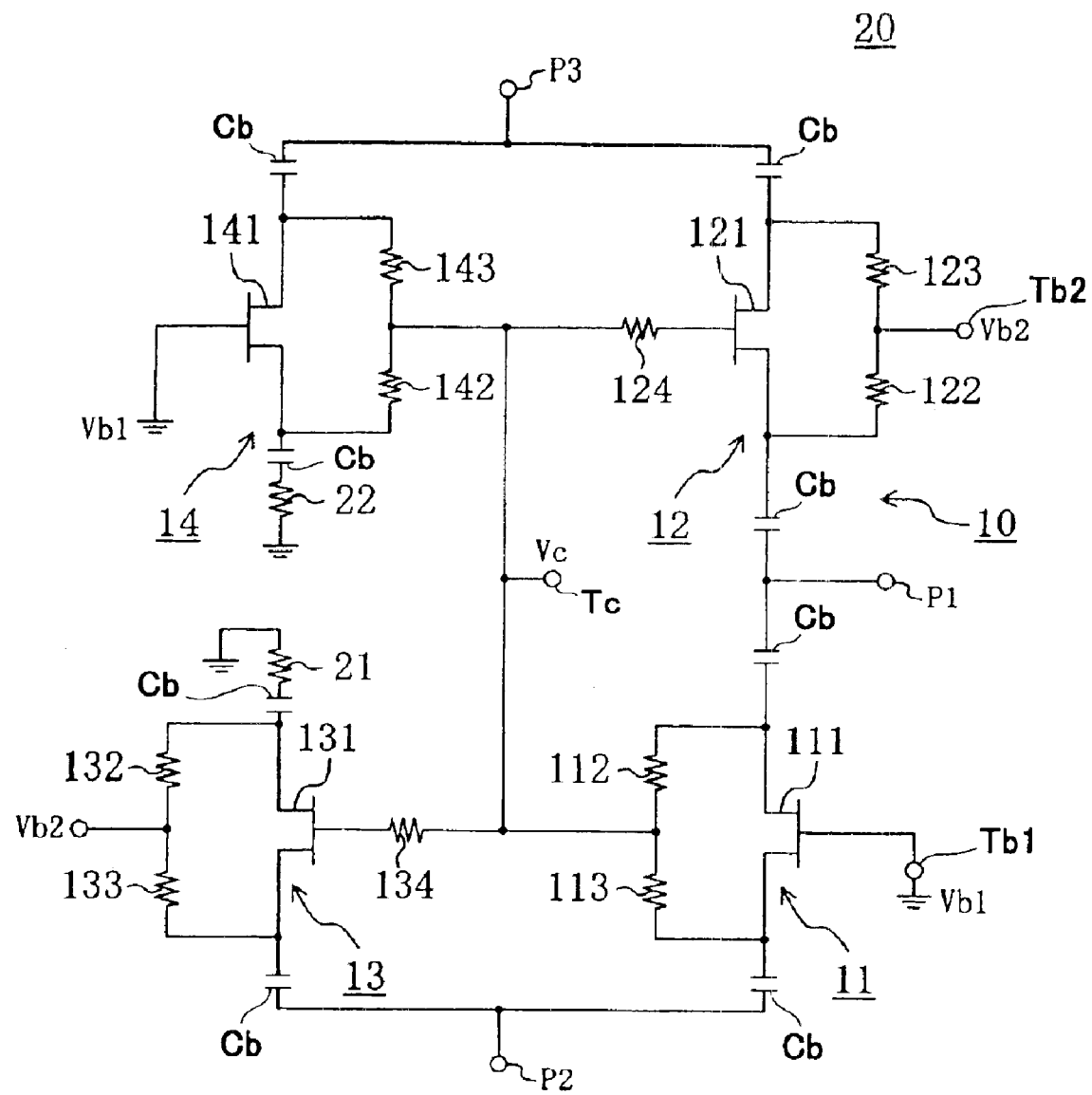
FIG. 13 is a circuit diagram of a switching device according to a second embodiment of the present invention.

Referring to FIG. 13, there is shown a circuit diagram of a switching device 20 of the present embodiment. The switching device 20 is implemented by addition of a FET switch 13 corresponding to a third FET of the present invention and a FET switch 14 corresponding to a forth FET of the present invention to the switching device 10 of the first embodiment. The same reference numerals as FIG. 1 represent like or equivalent parts and their description is omitted here. Furthermore, direct-current blocking capacitive elements Cb are connected to both ends of each of the FET switches 11–14.

The FET switch 13 has a third FET 131 (hereinafter referred to as the "FET 131"), and is constructed in the same way that the FET switch 12 is constructed. In other words, like the FET 121, the FET 131 is formed by a HEMT or HFET, and the control voltage Vc corresponding to the second control voltage is fed to the gate via a resistor element 134 similar to the resistor element 124. In addition, the bias voltage Vb2 corresponding to the third bias voltage is fed to the source via a source bias resistor element 132 similar to the source bias resistor element 122 and to the drain via a drain bias resistor element 133 similar to the drain bias resistor element 123. Here, the bias voltage Vb2 is common to the one that is fed to the FET switch 12, and the control voltage Vc is common to the one that is fed to the FET switches 11 and 12. Of course, the third bias voltage having a different value and the second control voltage having a different value may be applied instead of using the aforesaid common bias and control voltages.

The FET switch 14 has a fourth FET 141 (hereinafter referred to as the "FET 141"), and is constructed in the same way that the FET switch 11 is constructed. In other words, like the FET 111, the FET 141 is formed by a HEMT or HFET, and the bias voltage Vb1 corresponding to the fourth bias voltage is fed to the gate. In addition, the control voltage Vc corresponding to the second control voltage is fed to the source via a source bias resistor element 142 similar to the source bias resistor element 112 and to the drain via a drain bias resistor element 143 similar to the drain bias resistor element 113. Here, the bias voltage Vb1 is common to the one that is fed to the FET switch 11, and the control voltage Vc is common to the one that is fed to the FET switches 11 and 12. Of course, the fourth bias voltage having a different value and the second control voltage having a different value may be applied instead of using the aforesaid common bias and control voltages. In this case, it is required that the second control voltage is applied to be synchronized with the first control voltage.

Connected between the FET switch 13 and ground is a resistor element 21 which is a termination resistor element. The resistance value of the resistor element 21 is set such that the sum of the resistance value of the resistor element 21 and the channel resistance value of the FET 131 is equal to the characteristic impedance of a transmission line connected to the terminal P2. Accordingly, when the FET 131 enters the conductive state, the terminal P2 is terminated (the first termination state).

Likewise, connected between the FET switch 14 and ground is a resistor element 22 which is a termination resistor element. The resistance value of the resistor element 22 is set such that the sum of the resistance value of the resistor element 22 and the channel resistance value of the FET 141 is equal to the characteristic impedance of a transmission line connected to the terminal P3. Accordingly, when the FET 141 enters the conductive state, the terminal P3 is terminated (the second termination state).

If the channel resistance of the FET 131 in the conductive state is made equal to the transmission line characteristic impedance, this makes it possible to omit the provision of the resistor element 21. The same is applied to the resistor element 22.

Next, the operation of the switching device 20 as constructed above will be described below.

When 0.0 V is applied as the control voltage Vc, the FETs 111 and 141 are placed in the conductive state, while the FETs 121 and 131 are placed in the cutoff state. Hereby, the terminal P1 and the terminal P2 are connected to each other by the FET switch 11, and the terminal P3 is terminated by the FET switch 14. In other words, when the control voltage Vc is 0.0 V, the switching device 20 enters the first connection state and the second termination state.

Figure 14A:
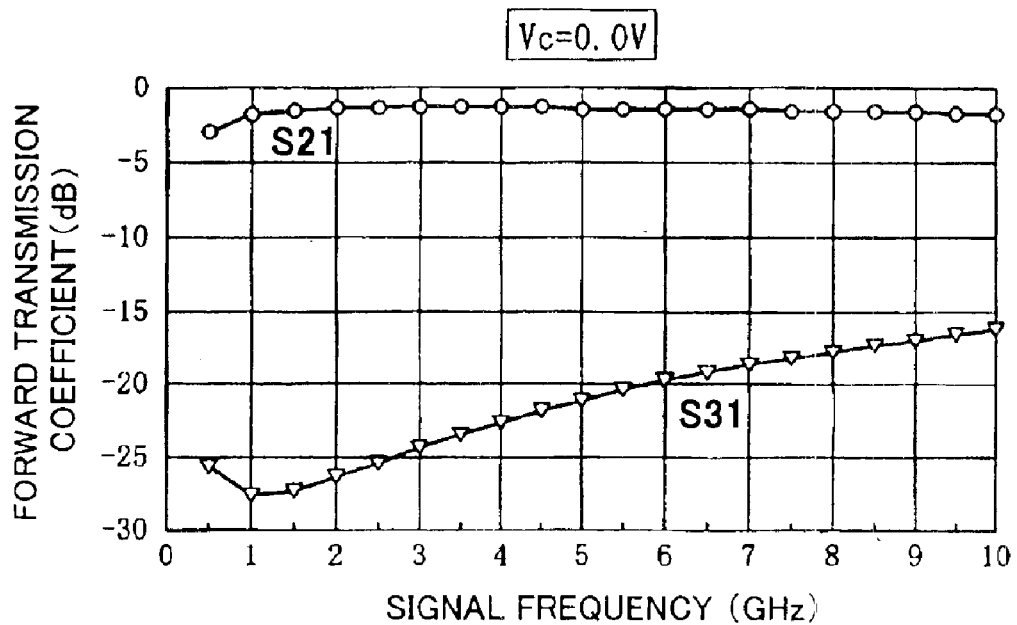
FIGS. 14A and 14B are graphs showing the switching characteristics and reflection characteristics of the switching device of FIG. 13.
Figure 14B:
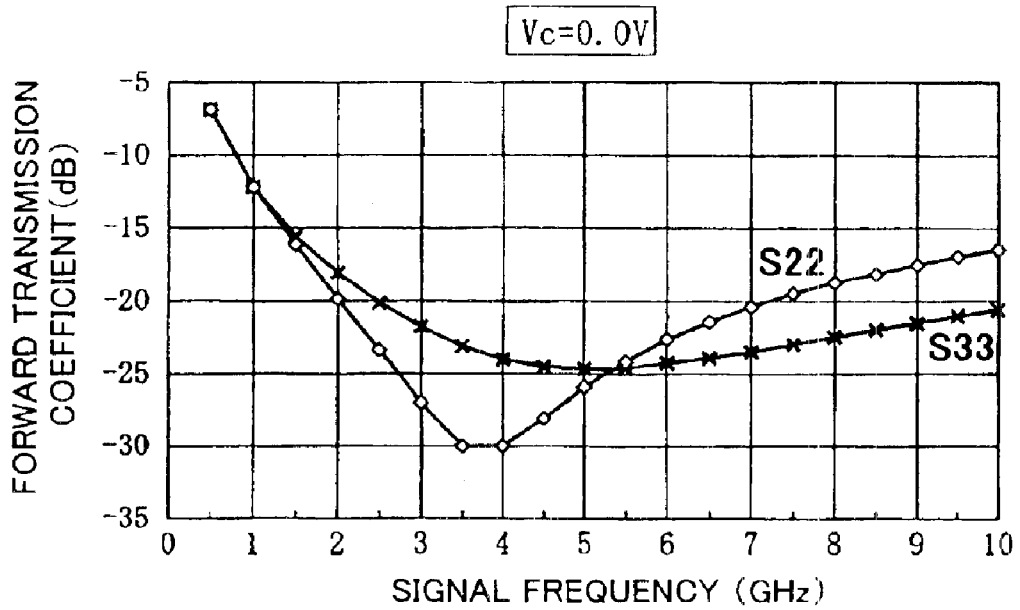

FIGS. 14A and 14B are graphs representing the various characteristics of the switching device 20 when 0.0 V is applied as the control voltage Vc. The way of looking at the graphs of FIGS. 14A and 14B is the same as FIG. 6. Comparison between FIG. 14A and FIG. 6A proves that the switching characteristics of the switching device 20 are substantially the same as the switching characteristics of the switching device 10. On the other hand, comparison between FIG. 14B and FIG. 6B proves that the reflection characteristic: S33 of the switching device 20 is improved extensively. The reason for this is that the terminal P3 is terminated by the FET switch 14 and the resistor element 22.

On the other hand, when 1.0 V is applied as the control voltage Vc, the FETs 111 and 141 enter the cutoff state while the FETs 121 and 131 enter the conductive state. Hereby, the terminal P1 and the terminal P3 are connected to each other by the FET switch 12, and the terminal P2 is terminated by the FET switch 13. Stated another way, when the control voltage Vc is 1.0 V, the switching device 20 enters the second connection state and the first termination state.

Figure 15A:
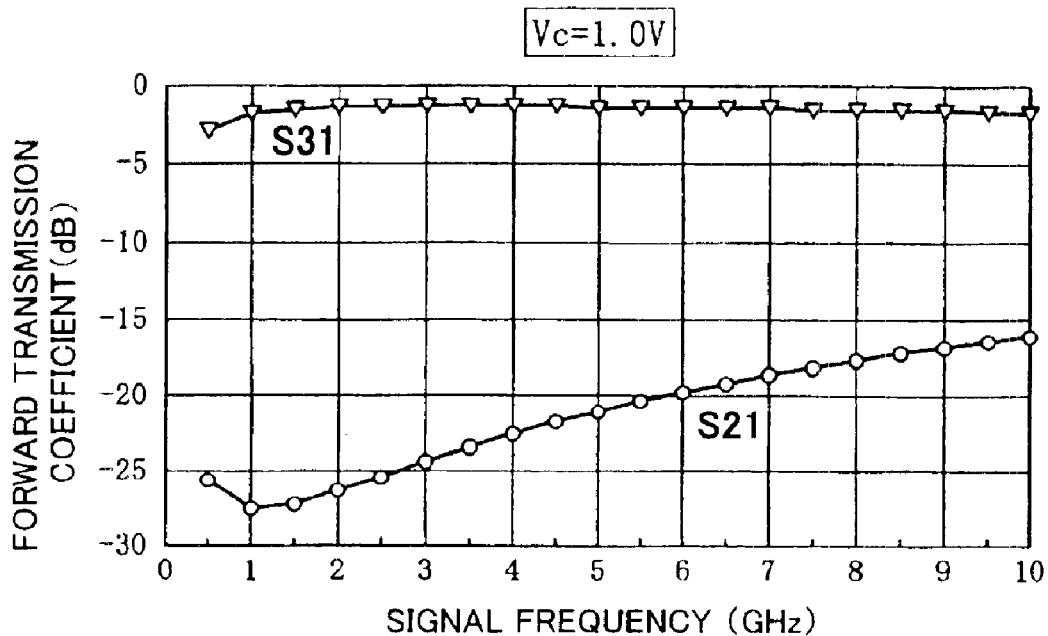
FIGS. 15A and 15B are graphs showing the switching characteristics and reflection characteristics of the switching device of FIG. 13.
Figure 15B:
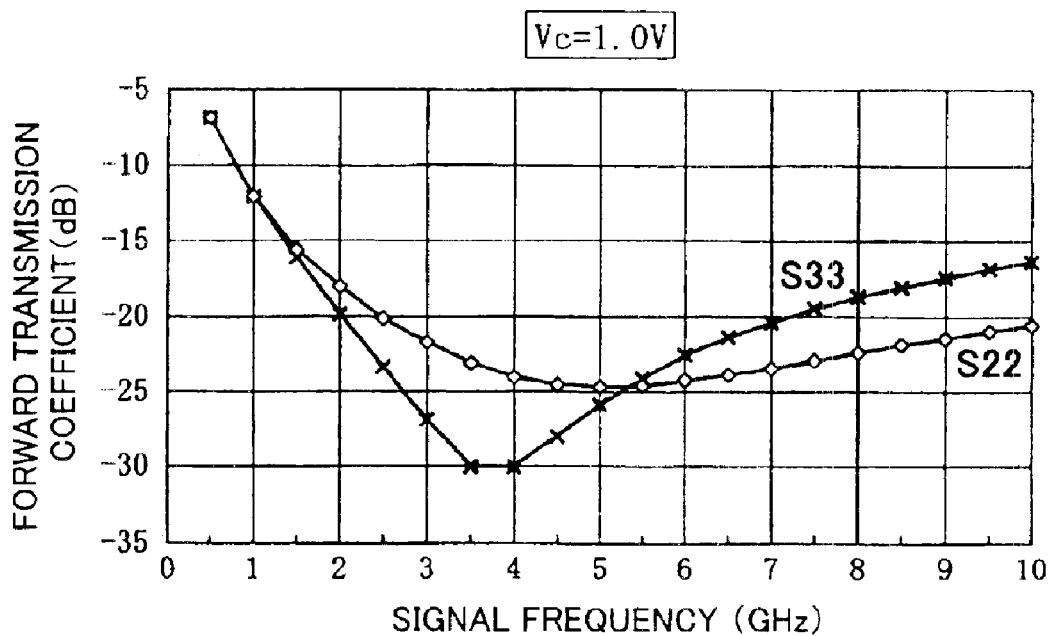

FIGS. 15A and 15B are graphs representing the various characteristics of the switching device 20 when 1.0 V is applied as the control voltage Vc. The way of looking at the graphs of FIGS. 15A and 15B is the same as FIG. 7. Comparison between FIG. 15A and FIG. 7A proves that the switching characteristics of the switching device 20 are substantially the same as the switching characteristics of the switching device 10. On the other hand, comparison between FIG. 15B and FIG. 7B proves that the reflection characteristic: S22 of the switching device 20 is improved extensively. The reason for this is that the terminal P2 is terminated by the FET switch 13 and the resistor element 21.

As has been described above, in accordance with the present embodiment, the FET switches 11-14 respectively provided with the FETs 111-114 formed by HEMTs or HFETs are operated in a complementary switching manner by the single control voltage Vc, thereby the path can be switched such that the switching device 20 enters the first connection state and the second termination state or the second connection state and the first termination state. Hereby, it becomes possible to terminate a terminal that is cut off at the time of path switching, and signal reflection at the terminal cut off is suppressed.

In the above description, the FET switches 11–14 are all controlled by the common control voltage Vc. However, the FET switches 13 and 14 may be controlled independently. Furthermore, it may be arranged such that, with respect to the first combination of the FET switches 11 and 13, these FET switches are switch controlled in a complementary manner by the use of the first control voltage, and, with respect to the second combination of the FET switches 12 and 14, these FET switches are switch controlled in a complementary manner by using the second control voltage in synchronization with the first control voltage. Furthermore, complementary switch control may be performed only with respect to either one of the first and second combinations. In each case, the same effects as the present invention are obtained. However, in the light of control ease and circuitry simplification, it is preferable that the bias voltage Vb1, the bias voltage Vb2, and the control voltage Vc are made common, as in the present embodiment.

In the diagrams graphically representing the various characteristics, the signal frequency is indicated up to 10 GHz. The present invention is not limited to such a frequency. The switching devices 10 and 20 of the present invention are applicable to a millimeter wave band from 60 GHz to 75 GHz, and are applicable to a high frequency band. On the contrary to this, the switching devices 10 and 20 of the present invention achieve the above-described effects even in frequency bands lower than the frequencies shown in the graphs. More specifically, the switching devices 10 and 20 of the present invention are applied suitably for signal transmission paths of frequencies of not less than 100 MHz and not more than 75 GHz and more suitably for signal transmission paths of frequencies of not less than 100 MHz and not more than 10 GHz.

Embodiment 3

Figure 16:
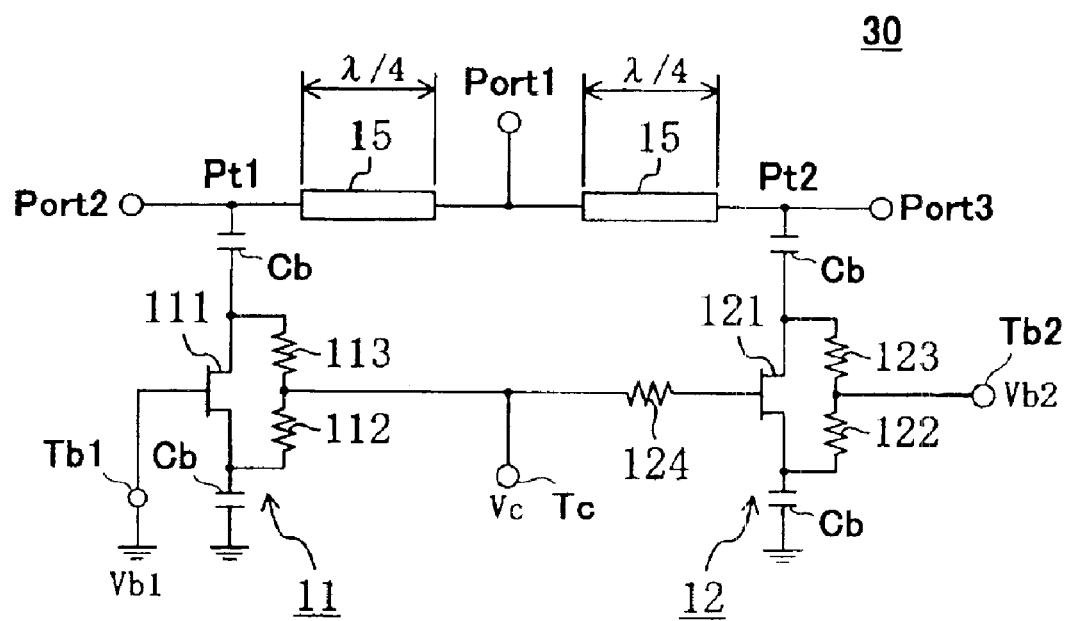
FIG. 16 is a schematic circuit diagram of a switching device according to a third embodiment of the present invention.

FIG. 16 is a schematic circuit diagram of a switching device 30 in accordance with a third embodiment of the present invention. In FIG. 16, the same reference numerals as FIG. 1 represent like or equivalent parts. The switching device 30 is the switching device 10 of the first embodiment further comprising a transmission line 15 which has a terminal Port2 (i.e., a second transmission signal terminal) at its one end and a terminal Port3 (i.e., a third transmission signal terminal) at the other end, wherein the FET switches 11 and 12 are connected, via the transmission line 15, to a terminal Port1 (i.e., a first transmission signal terminal) equivalent to the terminal P1, and the terminals P2 and P3 are connected to ground.

More specifically, the switching device 30 provided with the FET 11 by which a first point Pt1 can be connected to ground and the FET 12 by which a second point Pt2 can be connected to ground, wherein switching between a first transmission signal connection state and a second transmission signal connection state is established, thereby the transmission-signal transmission path is switched. In the first transmission signal connection state, the terminal Port1 and the terminal Port2 are connected to each other so that transmission signals are transmittable while the terminal Port1 and the terminal Port3 are disconnected from each other so that no transmission signal is transmittable. In the second transmission signal connection state, the terminal Port1 and the terminal Port3 are connected to each other so that transmission signals are transmittable while the terminal Port1 and the terminal Port2 are disconnected from each other so that no transmission signal is transmittable. For the sake of description convenience, the single transmission line 15, which is actually a continuous line, is depicted in a divided manner.

The FET switch 11 has, in a portion of the transmission line 15 between the terminal Port1 and the terminal Port2, the first FET 111 provided between the first point Pt1 which is located a distance corresponding to $\lambda/4$ (where $\lambda$ is the transmission signal frequency) apart from the terminal Port1 toward the terminal Port2 and ground, and the first point Pt1 is grounded when the FET 111 is placed in the conductive state. The FET 111 is connected, via direct-current blocking capacitive elements Cb, to the first point Pt1 and to ground.

On the other hand, the FET switch 12 has, in a portion of the transmission line 15 between the terminal Port1 and the terminal Port3, the second FET 121 provided between the second point Pt2 which is located a distance corresponding to $\lambda/4$ apart from the terminal P1 toward the terminal Port3, and the second point Pt2 is grounded when the FET 121 is placed in the conductive state. The FET 121 is connected, via direct-current blocking capacitive elements Cb, to the second point Pt2 and to ground.

The transmission line 15 is made up of a 100 $\mu$m-thick GaAs substrate having a ground electrode on lower surface thereof, and an Au pattern, 20 $\mu$m in width and 5 $\mu$m in thickness, formed on the GaAs substrate.

The terminals Port1, Port2, and Port3 are connected to other transmission lines or high frequency circuits, and high-frequency alternating-current transmission signals are input to and output from the terminals Port1, Port2, and Port3 and are transmitted along the transmission line 15. Preferably, the frequency of such transmission signals is not less than 100 MHz and not more than 75 GHz, more preferably not less than 100 MHz and not more than 10 GHz. More specifically, 5 GHz is assumed as the transmission signal frequency.

The FETs 111 and 121 are implemented by GaAs n-channel depletion type FETs called the HEMTs or HFETs. The first bias voltage Vb1 is applied to the gate of the FET 111, and the first control voltage Vc is applied, via the source bias resistor element 112 and the drain bias resistor element 113, to the source and the drain of the FET 111. On the other hand, the second bias voltage Vb2 is applied, via the source bias resistor element 122 and the drain bias resistor element 123, to the source and the drain of the FET 121, and the first control voltage Vc is applied, via the resistor element 124, to the gate of the FET 121.

Other arrangements are the same as the first embodiment.

Figure 17A:
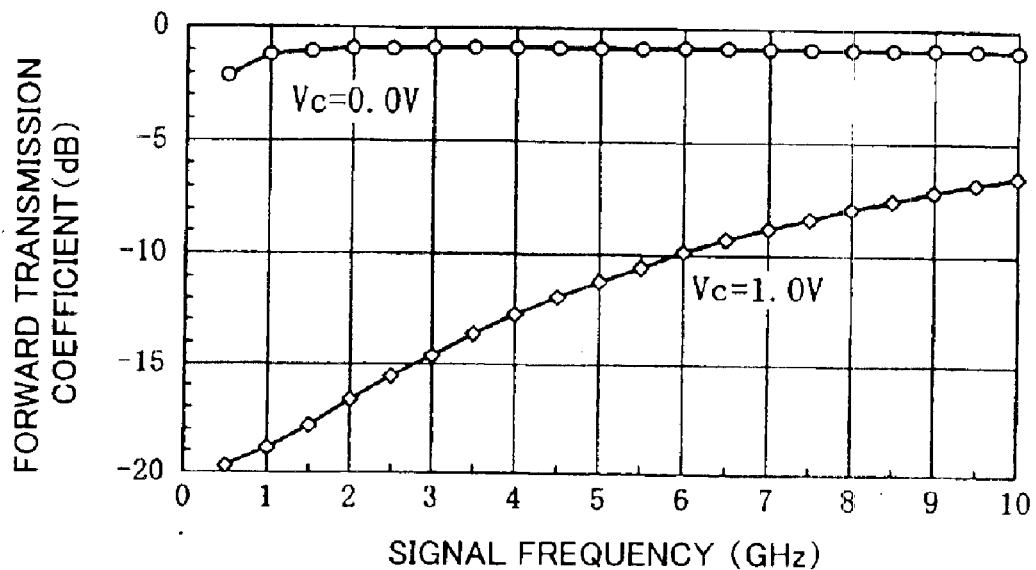
FIGS. 17A and 17B are graphs showing the switching characteristics of the switching device of FIG. 16.
Figure 17B:
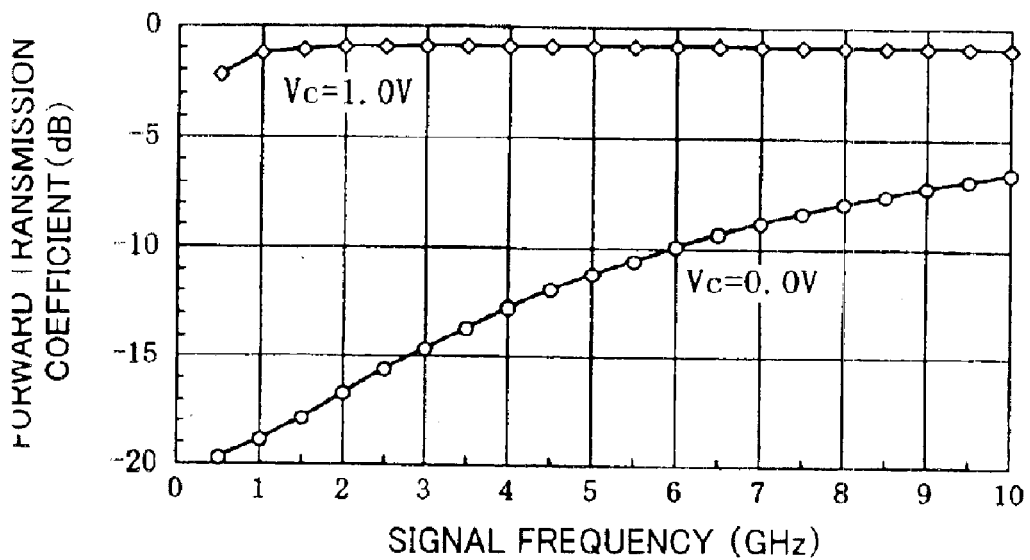

FIGS. 17A and 17B are graphs showing the switching characteristics of the FETs 11 and 12 when (a) the bias voltage Vb1 is 0.0 V, (b) the bias voltage Vb2 is 1.0 V, and (c) the control voltage Vc takes two values, namely a value of 0.0 V (Vcl) corresponding to the first bias voltage Vb1 and a value of 1.0 V (Vch) corresponding to the second bias voltage Vb2. The vertical axis represents the signal level (forward transmission coefficient) when the signal is transmitted from the drain to the source of a FET and the unit is dB, and the horizontal axis represents the signal frequency and the unit is GHz.

Referring to FIG. 17A, there are shown the switching characteristics of the FET switch 11. In the FET switch 11, the source and the drain are electrically connected to each other when the control voltage Vc is 0.0 V, and the source and the drain are electrically disconnected from each other when the control voltage Vc is 1.0 V. On the other hand, FIG. 17B shows the switching characteristics of the FET switch 12. Contrary to the FET switch 11, in the FET switch 12, the source and the drain are electrically disconnected from each other when the control voltage Vc is 0.0 V, and the source and the drain are electrically connected to each other when the control voltage Vc is 1.0 V. Hereby, the FET 111 and the FET 121 can be placed in the conductive state in a complementary manner with the single control voltage Vc. The switching characteristics of FIGS. 17A and 17B are obtained when the resistance value of each of the resistor elements 112, 113, 122, and 123 is 5 kΩ; however, even when the resistance value is about 500 Ω, there is no great variation in the switching characteristics. The resistance value can be about 100 Ω, depending upon the characteristics of the FETs 111 and 121.

The operation of the switching device 30 as constructed above will be described in detail.

When 0.0 V is applied as the control voltage Vc, the FET 111 enters the conductive state while the FET 121 enters the cutoff state. As a result, the first point Pt1 is grounded by the FET switch 11. At this time, when viewed from the terminal Port1, the transmission line 15 on the grounded side becomes equivalent to a 1/4λ line of termination short-circuiting and becomes equal to the open state, i.e., the non-connection state. On the other hand, since the FET switch 12 is in the open state, signals are transmitted toward the terminal Port3. Stated another way, when the control voltage Vc is 0.0 V, the switching device 30 enters the second transmission signal connection state.

Figure 18A:
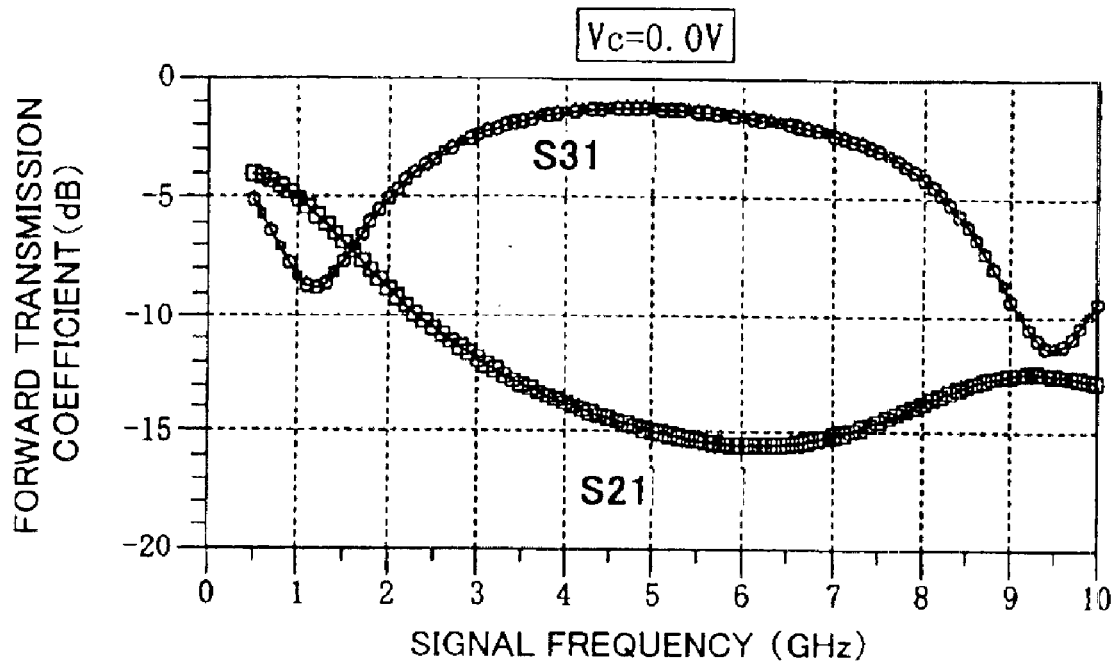
FIGS. 18A and 18B are graphs showing the switching characteristics and reflection characteristics of the switching device of FIG. 16.
Figure 18B:
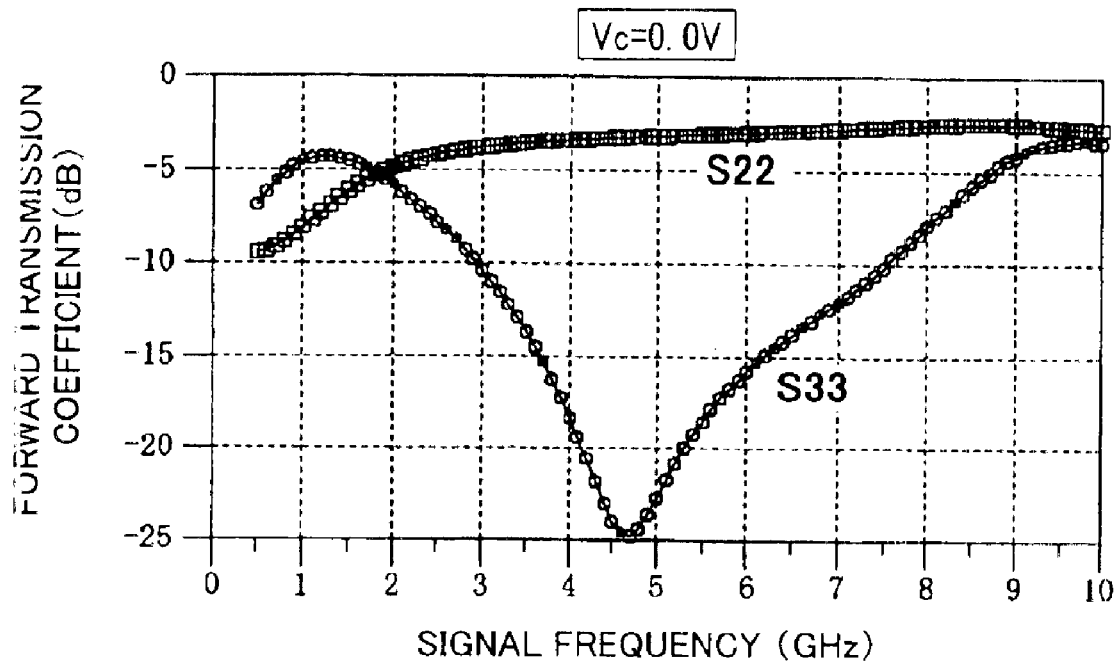

FIGS. 18A and 18B are graphs showing the various characteristics of the switching device 30 when the control voltage Vc is 0.0 V. The horizontal axis represents the signal frequency. FIG. 18A shows the transmission characteristics (forward transmission coefficient: S21) of a signal from the terminal Port1 to the terminal Port2, and the transmission characteristics (forward transmission coefficient: S31) of a signal from the terminal Port1 to the terminal Port3. Additionally, FIG. 18B shows the reflection characteristics (reflection coefficient: S22) at the terminal Port2 and the reflection characteristics (reflection coefficient: S33) at the terminal Port3. The unit of the vertical axis is dB and the unit of the horizontal axis is GHz. As can be seen clearly from the transmission characteristics of FIG. 18A, the terminal Port1 is in a connection relationship with the terminal Port3 while the terminal Port1 is in a disconnection relationship with the terminal Port2. It is hard to say that the reflection characteristic: S22 is at satisfactory levels. A way of improving the reflection characteristic: S22 will be described later.

When 1.0 V is applied as the control voltage Vc, the FET 111 enters the cutoff state while the FET 121 enters the conductive state. Hereby, the second point Pt2 is grounded by the FET switch 12. At this time, when viewed from the terminal Port1, the transmission line 15 on the grounded side is placed in the open state, i.e., it becomes equivalent to the non-connection state, and signals are transmitted toward the terminal Port2. Stated another way, when the control voltage Vc is 1.0 V, the switching device 30 enters the first transmission signal connection state. Although not shown diagrammatically, the various characteristics of the switching device 30 when the control voltage Vc is 1.0 V are the same as FIGS. 18A and 18B from the circuit symmetric property.

In FIGS. 18A and 18B, as the switching characteristics of the switching device 30, only the transmission signal switching characteristics of up to 10 GHz are shown; however, the switching device 30 provides the same effects for transmission signals of more than 10 GHz, i.e., a millimeter wave band from 60 GHz to 75 GHz. Furthermore, the switching device 30 is applicable to transmission signals of a high frequency level in excess of the millimeter wave band.

In the above description, the first bias voltage Vb1 is set at 0.0 V and the second bias voltage Vb2 is set at 1.0 V; however, other voltage values may be used as described in the first embodiment. In addition, the control voltage Vc takes two values, namely a voltage corresponding to the first bias voltage Vb1 and a voltage corresponding to the second bias voltage Vb2; however, the present invention is not limited to this for the reason described in the first embodiment.

As described above, in accordance with the present embodiment, it is possible to switch transmission-signal transmission path by grounding the first and second points Pt1 and Pt2 on the transmission line 15 by means of the FET switches 11 and 12. Hereby, transmission loss will not occur when signals are transmitted. Additionally, the FET switches 11 and 12 can be switched on and off in a complementary manner with the single control voltage Vc so that the first transmission signal connection state and the second transmission signal connection state are set in a complementary manner. As a result, control becomes easy. Furthermore, since the bias voltage Vb1, the bias voltage Vb2, and the control voltage Vc are all set higher than the ground potential, the switching device 30 can operate only with a positive power supply. This eliminates the need for the provision of a negative power supply for supplying a negative voltage, thereby reducing the circuit scale.

Embodiment 4

As has been described previously, it is hard to say that the reflection characteristic: S22 of FIG. 18A is at satisfactory levels. The switching device according to the second embodiment of the present invention intends to improve the reflection characteristic: S22.

Figure 19:
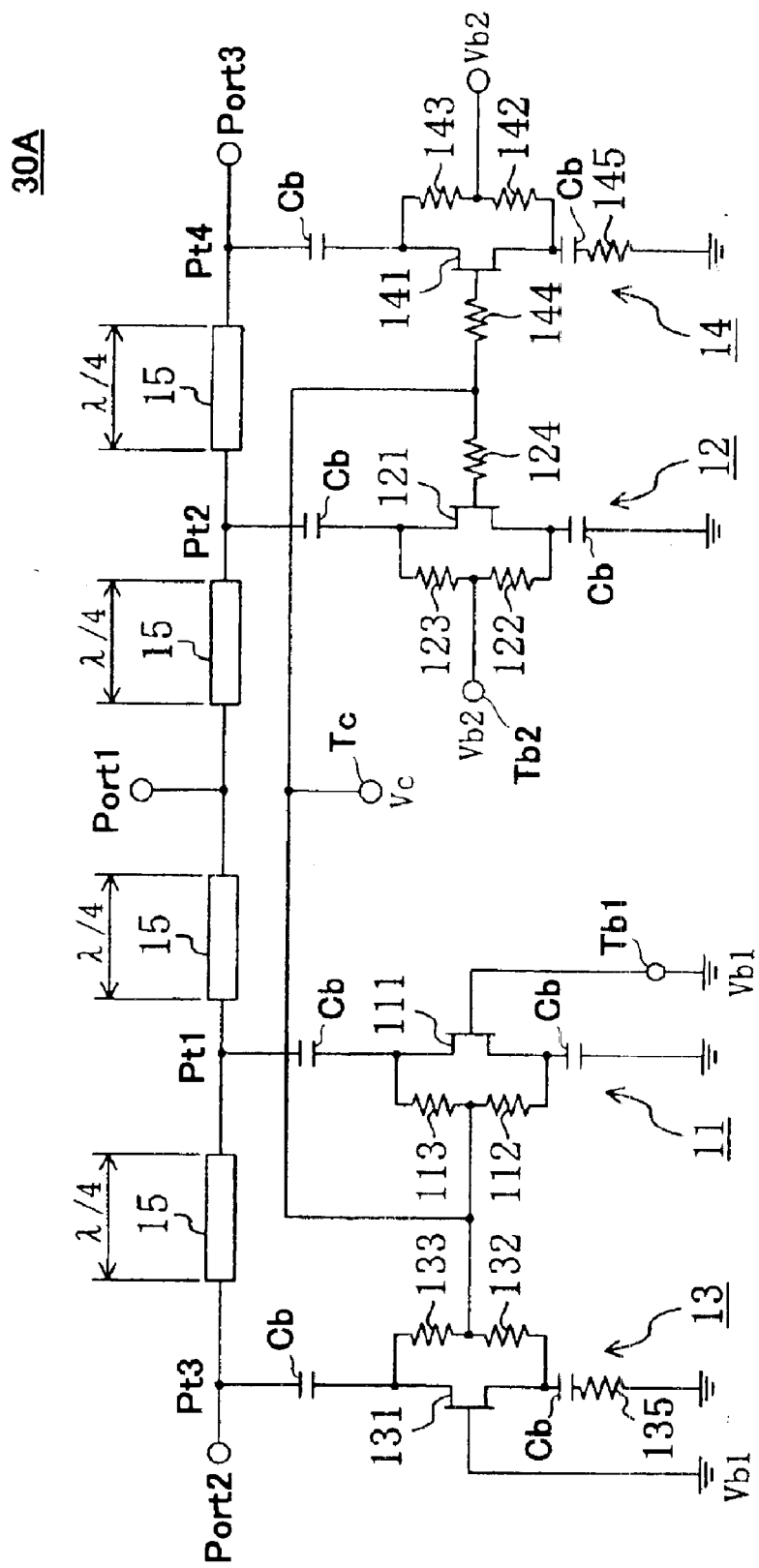
FIG. 19 is a schematic circuit diagram of a switching device according to a fourth embodiment of the present invention.

Referring to FIG. 19, there is illustrated a schematic circuit diagram of a switching device 30A formed according to the present embodiment. The switching device 30A is a modification of the switching device 30 of the third embodiment with the addition of a third FET 13 capable of termination of a third point Pt3 and a fourth FET 14 capable of termination of a fourth point Pt4. For the sake of description convenience, the single transmission line 15, which is actually a continuous line, is depicted in a divided manner.

The FET switch 13 has, in a portion of the transmission line 15 between the first point Pt1 and the terminal Port2, a third FET 131 provided between the third point Pt3 which is located a distance corresponding to λ/4 apart from the first point Pt1 toward the terminal Port2 and ground, and a resistor element (termination resistor element) 135 connected between the source of the FET 131 and ground, and when the FET 131 enters the conductive state, the third point Pt3 is terminated. The resistance value of the resistor element 135 is adjusted such that the sum of the resistance value of the resistor element 135 and the channel resistance value of the FET 131 equals the characteristic impedance of the transmission line 15. Additionally, the FET 131, the resistor element 132, and the resistor element 133 are the same as the FET 111, the resistor element 112, and the resistor element 113, respectively. In other words, the FET switch 13 has the same structure as the FET switch 11, with the exception that it has the resistor element 135, and exhibits the switching characteristics shown in FIG. 17A. The FET 131 is connected, via direct-current blocking capacitive elements Cb, to the third point Pt3 and to the resistor element 135.

On the other hand, the FET switch 14 has, in a portion of the transmission line 15 between the second point Pt2 and the terminal Port3, a fourth FET 141 provided between the fourth point Pt4 which is located a distance corresponding to λ/4 apart from the second point Pt2 toward the terminal Port3 and ground, and a resistor element (termination resistor element) 145 connected between the source of the FET 141 and ground, and when the FET 141 enters the conductive state, the fourth point Pt4 is terminated. The resistance value of the resistor element 145 is adjusted such that the sum of the resistance value of the resistor element 145 and the channel resistance value of the FET 141 equals the characteristic impedance of the transmission line 15. Additionally, the FET 141, the resistor element 142, the resistor element 143, and the resistance element 144 are the same as the FET 121, the resistor element 122, the resistor element 123, and the resistance element 124, respectively. In other words, the FET switch 14 has the same structure as the FET switch 12, with the exception that it has the resistor element 145, and exhibits the switching characteristics shown in FIG. 17B. The FET 141 is connected, via direct-current blocking capacitive elements Cb, to the fourth point Pt4 and to the resistor element 145.

The first bias voltage Vb1 which is applied to the gate of the FET 111 is applied to the gate of the FET 131 as the third bias voltage. Additionally, the first control voltage Vc which is applied to the source and the drain of the FET 111 is applied, via the source bias resistor element 132 and the drain bias resistor element 133, to the source and the drain of the FET 131 as the second control voltage so that they are at substantially the same direct-current potential level. On the other hand, the second bias voltage Vb2 which is applied to the source and the drain of the FET 121 is applied, via the source bias resistor element 142 and the drain bias resistor element 143, to the source and the drain of the FET 141 as the fourth bias voltage so that they are at substantially the same direct-current potential level. Furthermore, the first control voltage Vc which is applied to the gate of the FET 121 is applied, via the resistor element 144, to the gate as the second control voltage. Since the concrete values of the control voltage Vc and the bias voltages Vb1 and Vb2 are as specifically described in the third embodiment, and their description is omitted here.

Hereinafter, the operation of the switching device 30A as constructed above will be described in detail.

When 0.0 V (Vc1) is applied as the control voltage Vc, a group of the FETs 111 and 131 enter the conductive state while a group of the FETs 121 and 141 enter the cutoff state. Hereby, the first point Pt1 is grounded by the FET switch 11 and the third point Pt3 is terminated by the FET switch 13, and the switching device 30A enters the second transmission signal connection state. When the first point Pt1 is grounded, the third point Pt3 which is located a distance of λ/4 apart from the first point Pt1 is in the same state as the state when it is opened at the transmission signal frequency (5 GHz).

Accordingly, termination of the third point Pt3 is equivalent to termination of an end of the transmission line 15, i.e., termination of the terminal Port2. Therefore, this makes it possible to suppress transmission signal reflection at the terminal Port2.

Figure 20A:
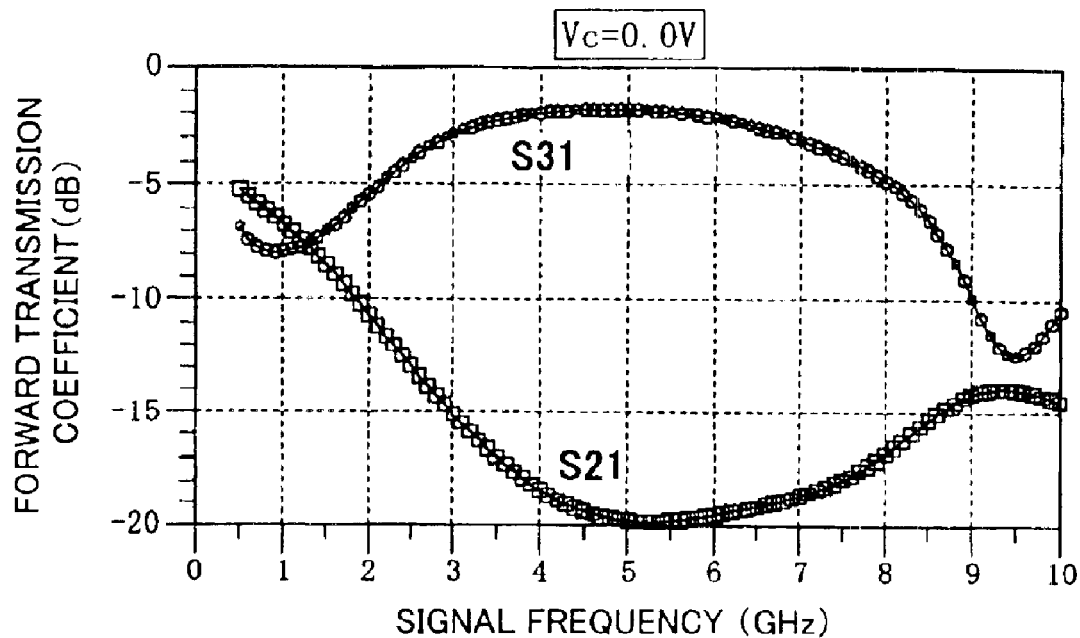
FIGS. 20A and 20B are graphs showing the switching characteristics and reflection characteristics of the switching device of FIG. 19.
Figure 20B:
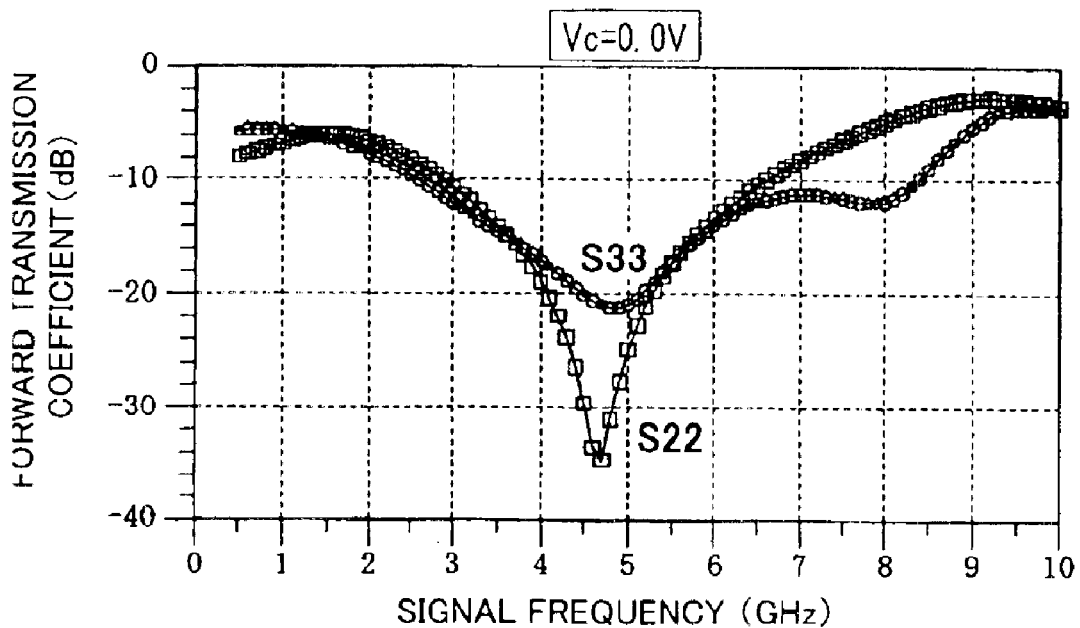

FIGS. 20A and 20B are graphs showing the various characteristics of the switching device 30A for the control voltage Vc=0.0 V. In each graph, the horizontal axis represents the signal frequency. The way of looking at the graphs of FIGS. 20A and 20B is the same as FIGS. 18A and 18B. As can bee seen from the transmission characteristics shown in FIG. 20A, the terminal Port1 is in a connection relationship with the terminal Port3 while the terminal Port1 is in a disconnection relationship with the terminal Port2, as in FIG. 18A. And, the reflection characteristic: S22 shown in FIG. 20B is not more than −20 dB in the vicinity of the transmission signal frequency (5 GHz), proving that signal reflection at the terminal Port2 is suppressed satisfactorily.

On the other hand, when 1.0 V (Vch) is applied as the control voltage Vc, the group of the FETs 111 and 131 enter the cutoff state while the group of the FETs 121 and 141 enter the conductive state. Hereby, the second point Pt2 is grounded by the FET switch 12 and the fourth point Pt4 is terminated by the FET switch 14, and the switching device 30A enters the first transmission signal connection state. When the second point Pt2 is grounded, the fourth point Pt4 which is located a distance of λ/4 apart from the second point Pt2 is in the same state as the state when it is opened at the transmission signal frequency (5 GHz). Accordingly, termination of the fourth point Pt4 is equivalent to termination of an end of the transmission line 15, i.e., termination of the terminal Port3. Therefore, this makes it possible to suppress transmission signal reflection at the terminal Port3. Although not shown diagrammatically, the various characteristics of the switching device 30A when the control voltage Vc is 1.0 V are the same as FIGS. 20A and 20B from the circuit symmetric property.

In FIGS. 20A and 20B, as the switching characteristics of the switching device 30A, only the transmission signal switching characteristics of up to 10 GHz are shown; however, the switching device 30A is able to provide the same effects for transmission signals of more than 10 GHz, i.e., a millimeter wave band from 60 GHz to 75 GHz. Furthermore, the switching device 30A is applicable to transmission signals of a high frequency level in excess of the millimeter wave band.

As described above, in accordance with the present embodiment, the third and fourth points Pt3 and Pt4 on the transmission line 15 are terminated by the FET switch 13 and by the FET switch 14, respectively, whereby signal reflection on the signal cutoff side is suppressed.

It is possible to omit the provision of the resistor elements 135 and 145 if the FETs 131 and 141 each have a channel resistance corresponding to the characteristic impedance value of the transmission line 15. The FET switches 11–14 are controlled with the single control voltage Vc; however, the present invention is not limited to such arrangement. It may be arranged such that the FET switches 11–14 are controlled individually. Alternatively, it may be arranged such that the FET switches 11–14 are controlled by the use of a negative voltage. In each arrangement, the present invention provides the same effects. In the case where the FET switches 11–14 are controlled individually, it is required that each control voltage Vc is applied in synchronization with the other.

In the third and fourth embodiments, it is arranged such that the FETs 111, 121, 131, and 141 are composed of GaAs-based semiconductor; however, the present invention is not limited to such arrangement. Preferably, the FETs 111, 121, 131, and 141 comprise a compound semiconductor composed of a compound made up of at least one element selected from among a group of Ga, In, and Al and at least one element selected from among a group of As, P, and N. Of course, the FETs 111, 121, 131 and 141 may be composed of a compound semiconductor containing other than the aforesaid elements. Additionally, the FETs 111, 121, 131, and 141 may be composed of a monocrystal semiconductor such as Si and Ge. Furthermore, the FET switches 11–14 are not necessarily formed by FETs and, even when they are formed by switching means other than FETs such as PIN diode switches, the present invention provides the same effects. Additionally, the FETs 111, 121, 131, and 141 may be p-channel type FETs and, alternatively, they may be implemented by enhancement type FETs, as in the first and second embodiments.

Finally, the distance between the first point Pt1 and the terminal Port1, the distance between the second point Pt2 and the terminal Port1, the distance between the first point Pt1 and the third point Pt3, and the distance between the second point Pt2 and the fourth point Pt4 are not limited to $\lambda/4$. It suffices if each distance corresponds to odd-numbered times the quarter-wavelength of a transmission signal. Additionally, each of these distances is not necessarily exactly odd-numbered times the quarter-wavelength of a transmission signal, that is, some margins of error are allowed. However, in the case where there are some margins of errors in the distance, the switching characteristic somewhat deteriorates. Stated another way, the allowable error is determined depending upon the switching characteristics. For the case of severe requirements, only a slight margin of error is allowed. On the other hand, for the case of relatively less severe requirements, a margin of error of up to about $\lambda/8$ is allowed.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the present invention. The details of the structure and/or function may be varied substantially without departing from the sprit of the present invention and all modifications which come within the scope of the appended claims are reserved.

What is claimed is:

1. A switching device comprising:
   a first connection terminal;
   a second connection terminal;
   a third connection terminal;
   a pair of first direct-current blocking capacitive elements;
   a first FET provided with a pair of main terminals, one of which is connected, via one of the first direct-current blocking capacitive elements, to the first connection terminal and the other of which is connected, via the other of the first direct-current blocking capacitive elements, to the second connection terminal;
   a pair of second direct-current blocking capacitive elements; and
   a second FET provided with a pair of main terminals, one of which is connected, via one of the second direct-current blocking capacitive elements, to the first connection terminal and the other of which is connected, via the other of the second direct-current blocking capacitive elements, to the third connection terminal;

wherein:
   a channel type of the first FET is the same as a channel type of the second FET,
   a first bias voltage is applied to a gate of the first FET,
   a second bias voltage is applied to the pair of main terminals of the second FET, and
   either one of voltages, which are respectively lower and higher than both a voltage derived from subtracting a gate threshold voltage of the first FET with a sign from the first bias voltage and a voltage derived from adding a gate threshold voltage of the second FET with a sign to the second bias voltage, is applied to the pair of main terminals of the first FET and to a gate of the second FET as a first control voltage,
   whereby the first FET and the second FET enter a conductive state and a cut off state in a complementary manner to allow switching between a first connection state and a second connection state,
   wherein in the first connection state, the first connection terminal and the second connection terminal are electrically connected to each other and the first connection terminal and the third connection terminal are electrically disconnected from each other, and
   in the second connection state, the first connection terminal and the third connection terminal are electrically connected to each other and the first connection terminal and the second connection terminal are electrically disconnected from each other,
   the switching device further comprising a third FET and a fourth FET, wherein:
   one of a pair of main terminals of the third FET is connected, via a third direct-current blocking capacitive element, to the second connection terminal while the other of the main terminals of the third FET is connected, via a fourth direct-current blocking capacitive element or via the fourth direct-current blocking capacitive element and a first termination resistor element, to ground,
   one of a pair of main terminals of the fourth FET is connected, via a fifth direct-current blocking capacitive element, to the third connection terminal while the other of the main terminals of the fourth FET is connected, via a sixth direct-current blocking capacitive element or via the sixth direct-current blocking capacitive element and a second termination resistor element, to ground,
   a channel type of the third FET is the same as a channel type of the fourth FET,
   a third bias voltage is applied to a gate of the fourth FET,
   a fourth bias voltage is applied to the pair of main terminals of the third FET, and
   either one of voltages, which are respectively lower and higher than both a voltage derived from subtracting a gate threshold voltage of the fourth FET with a sign from the third bias voltage and a voltage derived from adding a gate threshold voltage of the third FET with a sign to the fourth bias voltage, is applied, as a second control voltage, to the pair of main terminals of the fourth FET and to a gate of the third FET in synchronization with the first control voltage,
   whereby a group of the first and fourth FETs and a group of the second and third FETs enter the conductive state and the cut off state in a complementary manner, thereby the third connection terminal is terminated in the first connection state and the second connection terminal is terminated in the second connection state.

2. The switching device according to claim 1, wherein the first control voltage is applied as the second control voltage.

3. The switching device according to claim 1, wherein:
the first bias voltage is applied as the third bias voltage, and
the second bias voltage is applied as the fourth bias voltage.

4. A switching device comprising:
a first connection terminal;
a second connection terminal;
a third connection terminal;
a pair of first direct-current blocking capacitive elements;
a first FET provided with a pair of main terminals, one of which is connected, via one of the first direct-current blocking capacitive elements, to the first connection terminal and the other of which is connected, via the other of the first direct-current blocking capacitive elements, to the second connection terminal;
a pair of second direct-current blocking capacitive elements; and
a second FET provided with a pair of main terminals, one of which is connected, via one of the second direct-current blocking capacitive elements, to the first connection terminal and the other of which is connected, via the other of the second direct-current blocking capacitive elements, to the third connection terminal,
wherein:
a channel type of the first FET is the same as a channel type of the second FET,
a first bias voltage is applied to a gate of the first FET,
a second bias voltage is applied to the pair of main terminals of the second FET, and
either one of voltages, which are respectively lower and higher than both a voltage derived from subtracting a gate threshold voltage of the first FET with a sign from the first bias voltage and a voltage derived from adding a gate threshold voltage of the second FET with a sign to the second bias voltage, is applied to the pair of main terminals of the first FET and to a gate of the second FET as a first control voltage,
whereby the first FET and the second FET enter a conductive state and a cut off state in a complementary manner to allow switching between a first connection state and a second connection state,
wherein in the first connection state, the first connection terminal and the second connection terminal are electrically connected to each other and the first connection terminal and the third connection terminal are electrically disconnected from each other, and
in the second connection state, the first connection terminal and the third connection terminal are electrically connected to each other and the first connection terminal and the second connection terminal are electrically disconnected from each other,
the switching device further comprising a transmission line, having a second transmission signal terminal at one end thereof and a third transmission signal terminal at the other end thereof, for transmitting transmission signal,
wherein:
the first and second FETs are connected, via the transmission line, to the first connection terminal and the second and third connection terminals are connected to ground,
the first connection terminal is connected to a connection point on the transmission line, and the first FET is connected, via the first direct-current blocking capacitive element, to a first point on the transmission line which is located a distance corresponding to odd-numbered times the quarter-wavelength of the transmission signal apart from the connection point of the first connection terminal toward the second transmission signal terminal while the second FET is connected, via the second direct-current blocking capacitive element, to a second point on the transmission line which is located a distance corresponding to odd-numbered times the quarter-wavelength of the transmission signal apart from the connection point of the first connection terminal toward the third transmission signal terminal,
the first connection terminal constitutes a first transmission signal terminal, and
in response to switching between the first connection state and the second connection state, switching between a first transmission signal connection state and a second transmission signal connection state is established,
wherein, in the first transmission signal connection state, the first transmission signal terminal and the second transmission signal terminal are connected to each other to allow the transmission signal be transmitted and the first transmission signal terminal and the third transmission signal terminal are disconnected from each other not to allow the transmission signal be transmitted, and
in the second transmission signal connection state, the first transmission signal terminal and the third transmission signal terminal are connected to each other to allow the transmission signal be transmitted and the first transmission signal terminal and the second transmission signal terminal are disconnected from each other not to allow the transmission signal be transmitted.

5. The switching device according to claim 4, wherein a frequency of signal input to and output from the first, second, and third transmission signal terminals is not less than 100 MHz and not more than 75 GHz.

6. The switching device according to claim 5, wherein the frequency of signal input to and output from the first, second, and third transmission signal terminals is not less than 100 MHz and not more than 10 GHz.

7. The switching device according to claim 4, further comprising a third FET and a fourth FET,
wherein:
one of a pair of main terminals of the third FET is connected, via a third direct-current blocking capacitive element, to a third point which is located a distance corresponding to odd-numbered times the quarter-wavelength of the transmission signal apart from the first point toward the second transmission signal terminal on the transmission line, while the other of the main terminals of the third FET is connected, via a fourth direct-current blocking capacitive element or via the fourth direct-current blocking capacitive element and a first termination resistor element, to ground, and the ON resistance of the third FET or the sum of the ON resistance of the third FET and the resistance of the first termination resistor element is substantially the same as a characteristic impedance of the transmission line,
one of a pair of main terminals of the fourth FET is connected, via a fifth direct-current blocking capacitive element, to a fourth point which is located a distance corresponding to odd-numbered times the quarter-wavelength of the transmission signal apart from the second point toward the third transmission signal terminal on the transmission line, while the other of the main terminals of the fourth FET is connected, via a sixth direct-current blocking capacitive element or via the sixth direct-current blocking capacitive element and a second termination resistor element, to ground, and the ON resistance of the fourth FET or the sum of the ON resistance of the fourth FET and the resistance of the second termination resistor element is substantially the same as the characteristic impedance of the transmission line, a channel type of the third FET is the same as a channel type of the fourth FET, a third bias voltage is applied to a gate of the third FET, a fourth bias voltage is applied to the pair of main terminals of the fourth FET, and either one of voltages, which are respectively lower and higher than both a voltage derived from subtracting a gate threshold voltage of the third FET with a sign from the third bias voltage and a voltage derived from adding a gate threshold voltage of the fourth FET with a sign to the fourth bias voltage, is applied, as a second control voltage, to the pair of main terminals of the third FET and to a gate of the fourth FET in synchronization with the first control voltage, whereby a group of the first and third FETs and a group of the second and fourth FETs enter the conductive state and the cut off state in a complementary manner, thereby, in the first transmission signal connection state, the second point is grounded and the fourth point is terminated and, in the second transmission signal connection state, the first point is grounded and the third point is terminated.

8. The switching device according to claim 7, wherein the first control voltage is applied as the second control voltage.

9. The switching device according to claim 7, wherein:

the first bias voltage is applied as the third bias voltage, and the second bias voltage is applied as the fourth bias voltage.

* * * * *